US012142655B2

(12) United States Patent
Lin et al.

(10) Patent No.: US 12,142,655 B2
(45) Date of Patent: Nov. 12, 2024

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Shih-Yao Lin, New Taipei (TW); Chen-Ping Chen, Toucheng Township (TW); Hsiaowen Lee, Hsinchu (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 340 days.

(21) Appl. No.: 17/336,599

(22) Filed: Jun. 2, 2021

(65) Prior Publication Data

US 2022/0037498 A1    Feb. 3, 2022

Related U.S. Application Data

(60) Provisional application No. 63/059,710, filed on Jul. 31, 2020.

(51) Int. Cl.
*H01L 29/423* (2006.01)
*H01L 21/02* (2006.01)
(Continued)

(52) U.S. Cl.
CPC .. *H01L 29/42392* (2013.01); *H01L 21/02532* (2013.01); *H01L 21/0259* (2013.01); *H01L 21/28518* (2013.01); *H01L 21/823807* (2013.01); *H01L 21/823814* (2013.01); *H01L 21/823864* (2013.01); *H01L 21/823871* (2013.01); *H01L 21/823878* (2013.01); *H01L 27/092* (2013.01); *H01L 29/0665* (2013.01); (Continued)

(58) Field of Classification Search
CPC ......... H01L 29/42392; H01L 21/02532; H01L 21/0259; H01L 27/092; H01L 29/0665; H01L 29/66545; H01L 29/66742; H01L 29/78696
See application file for complete search history.

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

KR   20190055774 A   5/2019
TW   I651769 B       2/2019
(Continued)

*Primary Examiner* — Jay C Kim
*Assistant Examiner* — Woo K Lee
(74) *Attorney, Agent, or Firm* — Slater Matsil, LLP

(57) ABSTRACT

In an embodiment, a device includes: an isolation region; nanostructures protruding above a top surface of the isolation region; a gate structure wrapped around the nanostructures, the gate structure having a bottom surface contacting the isolation region, the bottom surface of the gate structure extending away from the nanostructures a first distance, the gate structure having a sidewall disposed a second distance from the nanostructures, the first distance less than or equal to the second distance; and a hybrid fin on the sidewall of the gate structure.

20 Claims, 53 Drawing Sheets

(51) Int. Cl.
  *H01L 21/285* (2006.01)
  *H01L 21/8238* (2006.01)
  *H01L 27/092* (2006.01)
  *H01L 29/06* (2006.01)
  *H01L 29/45* (2006.01)
  *H01L 29/66* (2006.01)
  *H01L 29/786* (2006.01)

(52) U.S. Cl.
  CPC ........ *H01L 29/45* (2013.01); *H01L 29/66545* (2013.01); *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,243,040 B1 | 3/2019 | Park et al. |
| 10,468,527 B2 | 11/2019 | Yang et al. |
| 10,483,378 B2 | 11/2019 | Ching et al. |
| 10,510,620 B1 | 12/2019 | Chanemougame et al. |
| 10,535,733 B2 * | 1/2020 | Cheng .................. H01L 29/785 |
| 10,872,825 B2 | 12/2020 | Chiang et al. |
| 10,923,474 B2 | 2/2021 | Liaw |
| 11,329,163 B2 * | 5/2022 | More .............. H01L 21/823481 |
| 2019/0341450 A1 * | 11/2019 | Lee ................ H01L 21/823864 |
| 2020/0098878 A1 | 3/2020 | Guler et al. |
| 2020/0105753 A1 | 4/2020 | Kotlyar et al. |
| 2020/0243665 A1 | 7/2020 | Ching et al. |
| 2021/0184018 A1 * | 6/2021 | Khaderbad ....... H01L 21/76831 |
| 2021/0375857 A1 * | 12/2021 | Huang ................ H01L 29/0665 |

FOREIGN PATENT DOCUMENTS

| | | |
|---|---|---|
| TW | 201917898 A | 5/2019 |
| TW | 202006947 A | 2/2020 |
| TW | 202025394 A | 7/2020 |

\* cited by examiner

TRANSISTOR GATE STRUCTURES AND METHODS OF FORMING THE SAME

PRIORITY CLAIM AND CROSS-REFERENCE

This application claims the benefit of U.S. Provisional Application No. 63/059,710, filed on Jul. 31, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
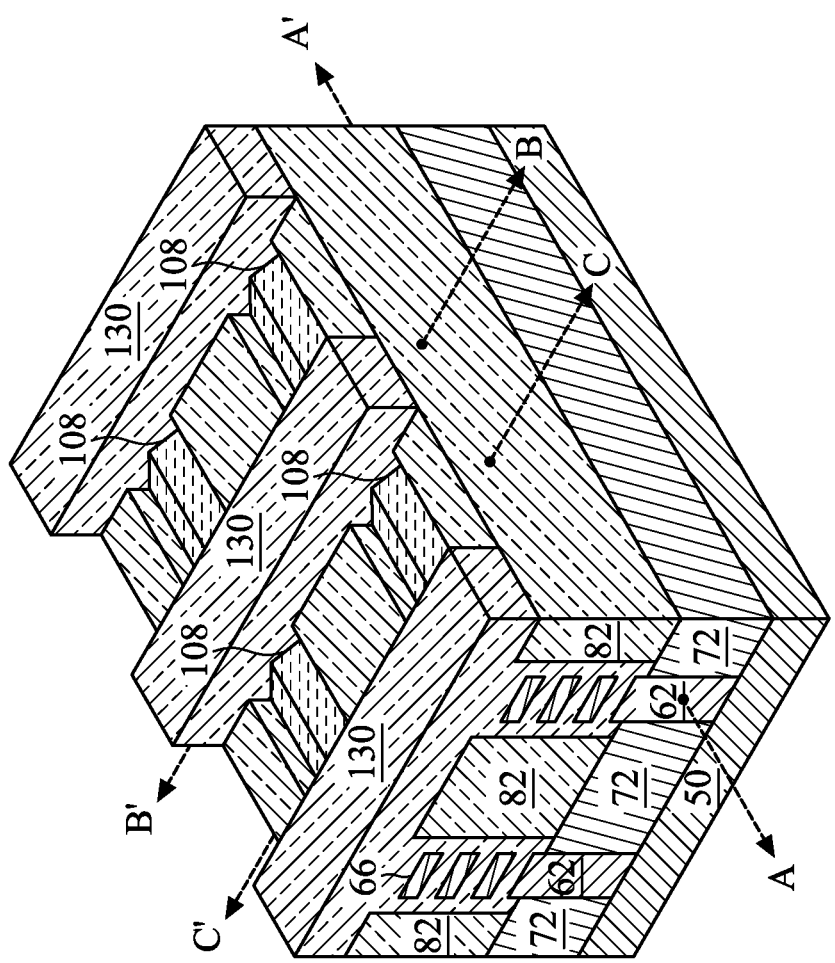
FIG. 1 illustrates an example of nanostructure transistors/FETs, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dummy gates with a small footing profile are formed around semiconductor fins and nanostructures, which are surrounded by a hybrid fin. The dummy gates are removed in a replacement gate process. Forming the dummy gates with a small footing profile may increase the processing window for subsequent operations, such as the replacement gate process and/or an epitaxial growth process for source/drain regions.

Embodiments are described in a particular context, a die including nanostructure transistors/FETs. Various embodiments may be applied, however, to dies including other types of transistors/FETs (e.g., fin field-effect transistors (finFETs), planar transistors, or the like) in lieu of or in combination with the nanostructure transistors/FETs.

FIG. 1 illustrates an example of nanostructure transistors/FETs (e.g., nanowire FETs, nanosheet FETs, or the like), in accordance with some embodiments. FIG. 1 is a three-dimensional view, where some features of the nanostructure transistors/FETs are omitted for illustration clarity. The nanostructure transistors/FETs may be nanosheet field-effect transistors (NSFETs), nanowire field-effect transistors (NWFETs), gate-all-around field-effect transistors (GAAFETs), or the like.

The nanostructure transistors/FETs include nanostructures 66 (e.g., nanosheets, nanowires, or the like) over semiconductor fins 62 on a substrate 50 (e.g., a semiconductor substrate), with the nanostructures 66 acting as channel regions for the nanostructure transistors/FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 130 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 130. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Hybrid fins 82 are disposed over the isolation regions 72, and between adjacent epitaxial source/drain regions 108. The hybrid fins 82 block epitaxial growth to prevent coalescing of some of the epitaxial source/drain regions 108 during epitaxial growth. For example, the hybrid fins 82 may be formed at cell boundaries to separate the epitaxial source/drain regions 108 of adjacent cells.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nanostructure transistor/FET. Cross-section B-B' is along a longitudinal axis of a gate structure 130 and in a direction, for example, perpendicular to a direction of current flow between the epitaxial source/drain regions 108 of a nanostructure transistor/FET. Cross-section C-C' is parallel to cross-section B-B' and extends through epitaxial source/drain regions 108 of the nanostructure transistors/FETs. Subsequent figures refer to these reference cross-sections for clarity.

Figure 2:
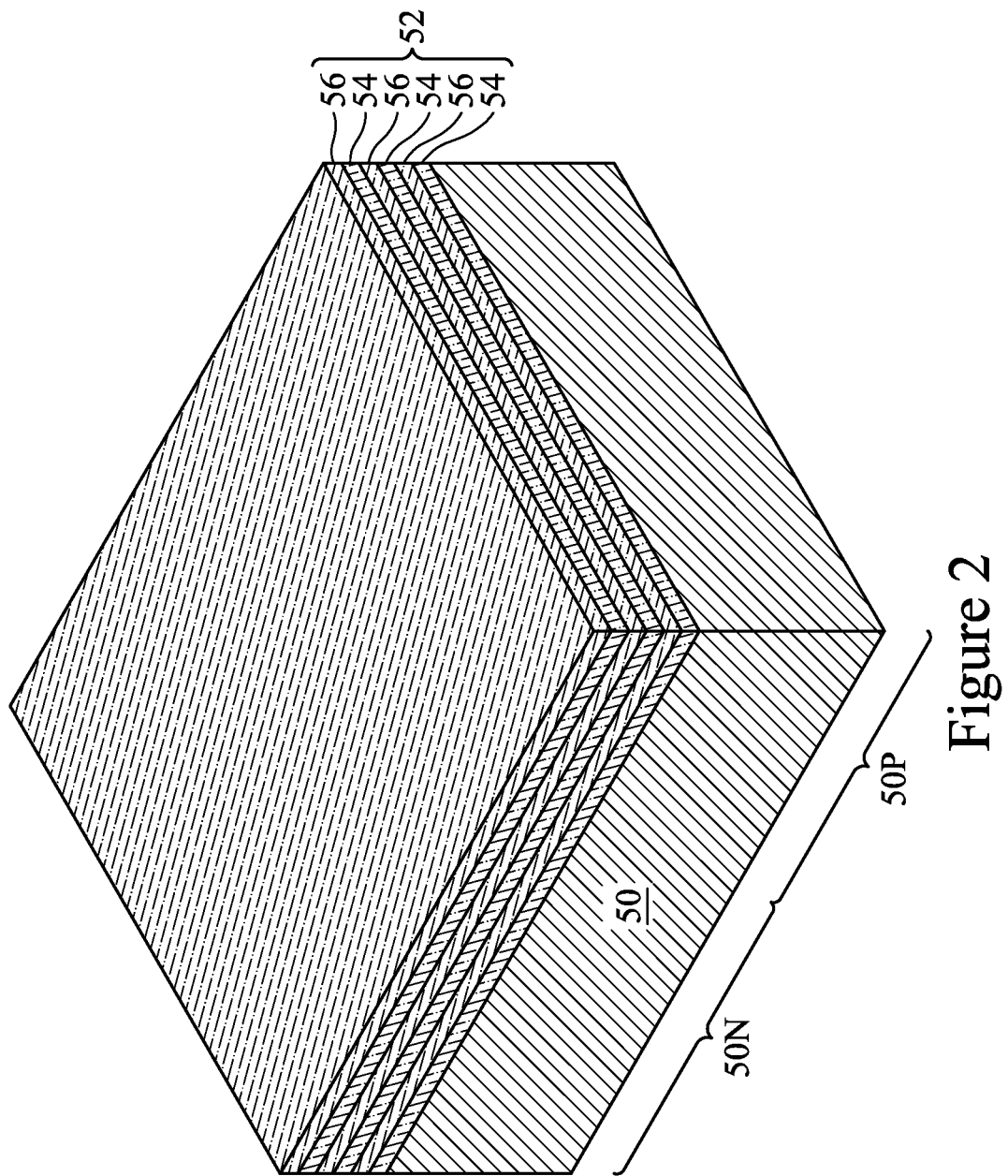
FIGS. 2-22C are views of intermediate stages in the manufacturing of nanostructure transistors/FETs, in accordance with some embodiments.
Figure 3:
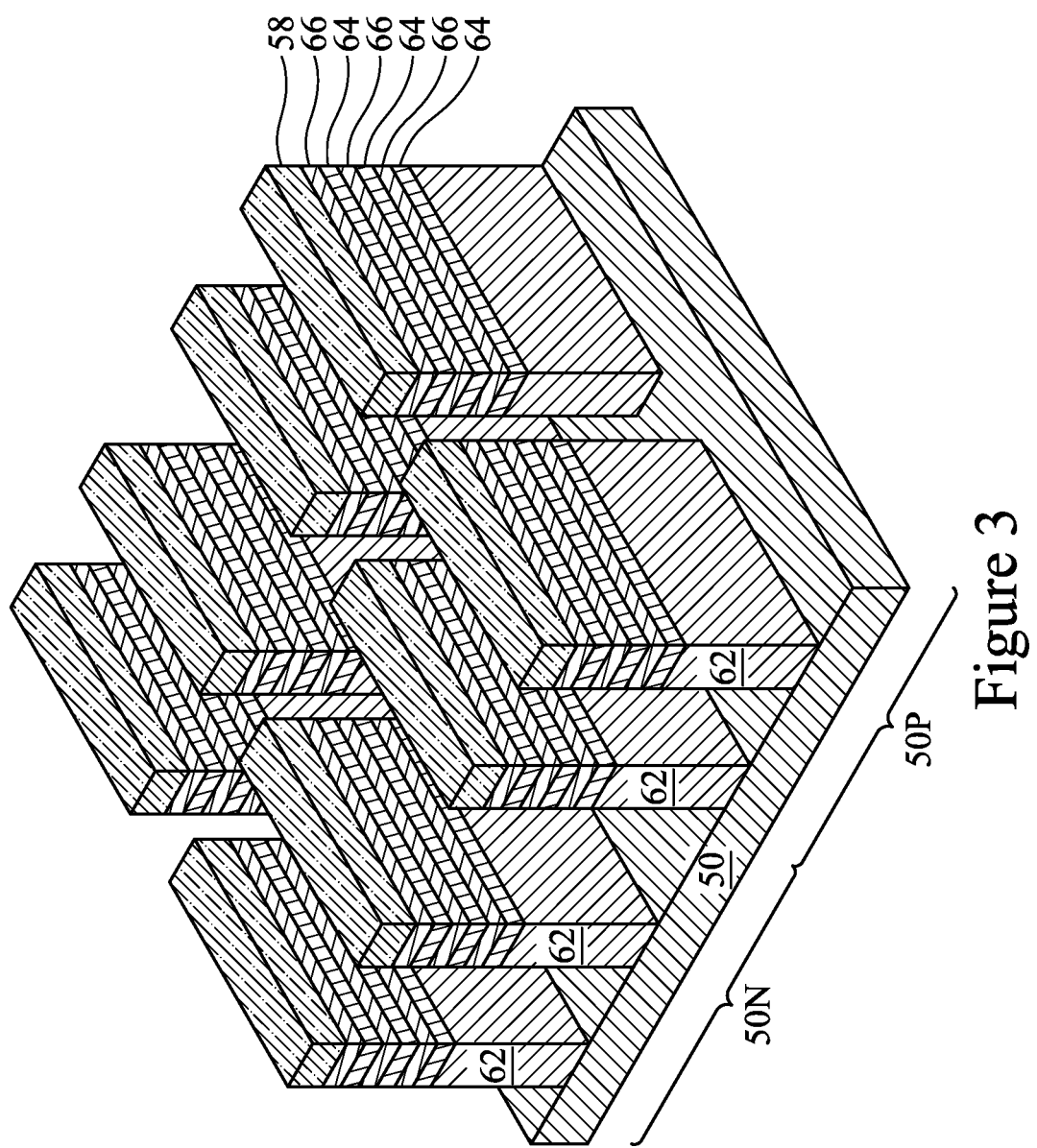
Figure 4:
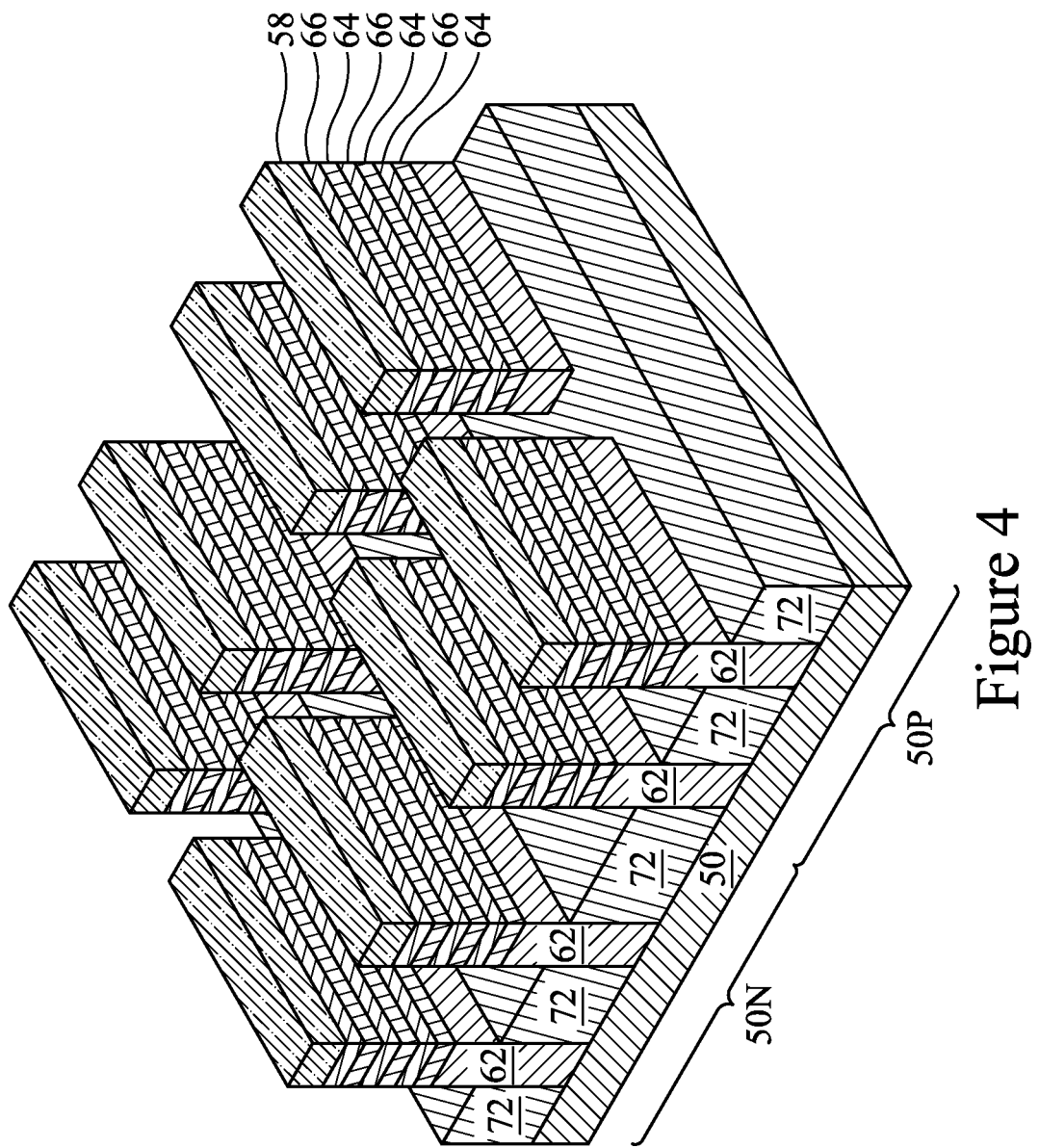

FIGS. 2-22C are views of intermediate stages in the manufacturing of nanostructure transistors/FETs, in accordance with some embodiments. FIGS. 2, 3, and 4 are three-dimensional views. FIGS. 5A, 6A, 10A, 11A, 12A, 13A, 14A, 15A, 16A, 17A, 18A, 19A, 20A, 21A, and 22A are cross-sectional views illustrated along a similar cross-section as reference cross-section A-A' in FIG. 1. FIGS. 5B, 6B, 7A-9C, 10B, 11B, 12B, 13B, 14B, 15B, 16B, 17B, 18B, 19B, 20B, 21B, and 22B are cross-sectional views illustrated along a similar cross-section as reference cross-section B-B' in FIG. 1. FIGS. 10C, 11C, 12C, 13C, 14C, 15C, 16C, 17C, 18C, 19C, 20C, 21C, and 22C are cross-sectional views illustrated along a similar cross-section as reference cross-section C-C' in FIG. 1.

In FIG. 2, a substrate 50 is provided for forming nanostructure transistors/FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nanostructure transistors/FETs, and the p-type region 50P can be for forming p-type devices, such as PMOS transistors, e.g., p-type nanostructure transistors/FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nanostructure transistors/FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nanostructure transistors/FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure transistors/FETs in one region (e.g., the p-type region 50P), and the second semiconductor layers 56 will be patterned to form channel regions for nanostructure transistors/FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of 5 nm to 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nanostructure transistors/FETs in both the n-type region 50N and the p-type region 50P, the first semiconductor layers 54 can have a first thickness and the second semiconductor layers 56 can have a second thickness, with the second thickness being from 30% to 60% less than the first thickness. Forming the second semiconductor layers 56 to a smaller thickness allows the channel regions to be formed at a greater density.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66. In some embodiments, the mask 58 (or other layer) may remain on the nanostructures 64, 66.

The semiconductor fins 62 and the nanostructures 64, 66 may each have widths in a range of 8 nm to 40 nm. In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P).

In FIG. 4, STI regions 72 are formed over the substrate 50 and between adjacent semiconductor fins 62. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner. A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask 58 remains on the nanostructures 64, 66, the planarization process may expose the mask 58 or remove the mask 58. After the planarization process, the top surfaces of the insulation material and the mask 58 (if present) or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof. In the illustrated embodiment, the top surfaces of the STI regions 72 are concave surfaces, such that portions of the STI regions 72 extend up the sidewalls of the semiconductor fins 62. The top surfaces of the STI regions 72 may be formed flat, convex, and/or concave by an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-22C illustrate various additional steps in the manufacturing of embodiment devices. FIGS. 5A-22C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, hybrid fins 82 will be formed between the semiconductor fins 62. FIGS. 5A-22C each illustrate two semiconductor fins 62 and portions of the hybrid fins 82 and the STI regions 72 that are disposed between the two semiconductor fins 62 in the respective cross-sections.

Figure 5A:
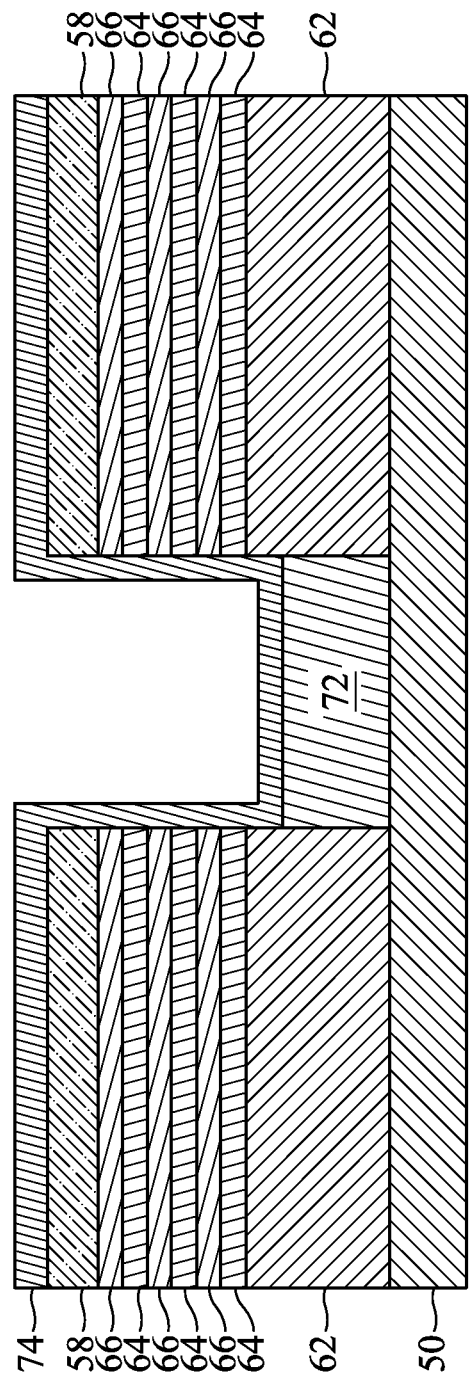
Figure 5B:
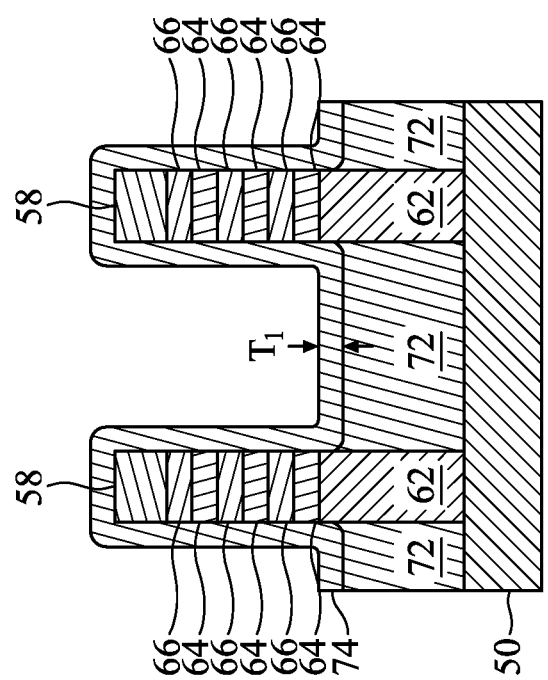

In FIGS. 5A-5B, a dummy gate layer 74 is conformally formed over the mask 58 (if present), the semiconductor fins 62, the nanostructures 64, 66, and the STI regions 72. The dummy gate layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the dummy gate layer 74 may be formed of silicon or silicon germanium. The dummy gate layer 74 can be formed to a thickness $T_1$ over the STI regions 72 in the range of 1 nm to 100 nm. The thickness of the dummy gate layer 74 determines the dimensions of the replacement gate structures for the nanostructure transistors/FETs.

Figure 6A:
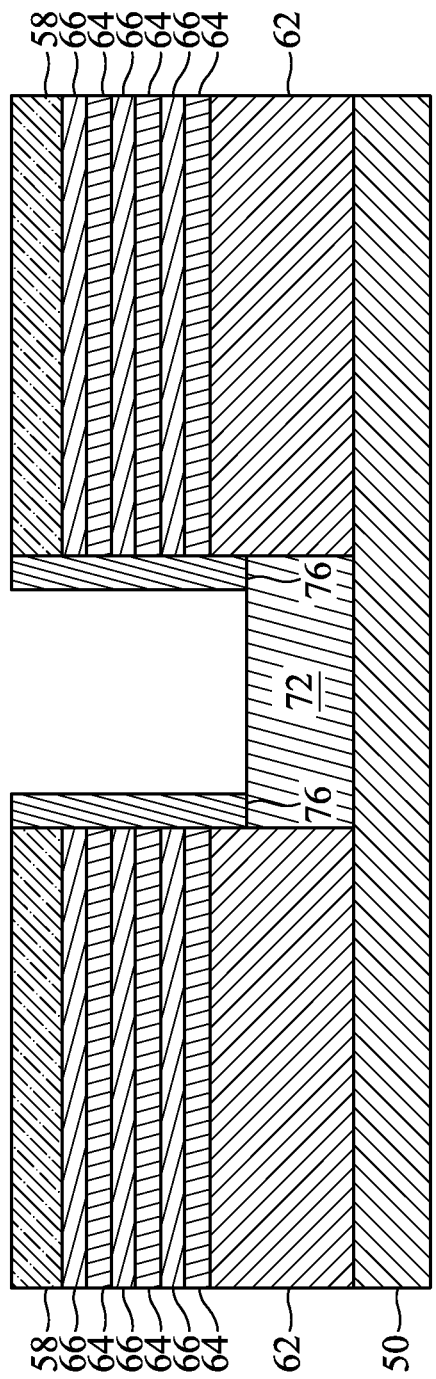
Figure 6B:
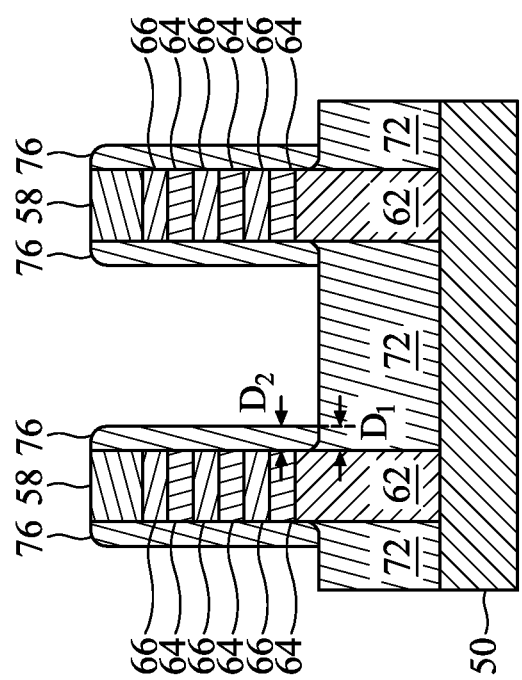

In FIGS. 6A-6B, the dummy gate layer 74 is patterned to form dummy gates 76 around the mask 58 (if present), the semiconductor fins 62, and the nanostructures 64, 66. The dummy gates 76 are disposed over the STI regions 72. The dummy gate layer 74, when patterned, has portions left on the sidewalls of the mask 58 (if present), the semiconductor fins 62, and the nanostructures 64, 66 (thus forming the dummy gates 76). The dummy gates 76 cover the sidewalls of the nanostructures 64, 66 that will be exposed in subsequent processing to form channel regions. The dummy gates 76 are used as temporary spacers during processing, and will subsequently be removed to expose sidewalls of the portions of the nanostructures 66 that will act as channel regions for the nanostructure transistors/FETs. Specifically, in the illustrated embodiment, the dummy gates 76 and the nanostructures 64 will be subsequently removed and replaced with gate structures that are wrapped around the nanostructures 66. The dummy gates 76 are formed of a material that has a high etching selectivity from the etching of the material of the nanostructures 66. The dummy gates 76 may be formed of the same semiconductor material as the nanostructures 64, or may be formed of a different material.

As will be subsequently described in greater detail, the dummy gates 76 are formed so that they have a small footing profile. The footing profile of the dummy gates 76 refers to the shape and dimensions of the portions of the dummy gates 76 that extend along the top surfaces of the STI regions 72. Forming the dummy gates 76 with a small footing profile refers to forming the dummy gates 76 so that the portions of the dummy gates 76 on the top surfaces of the STI regions 72 do not flare outward along the concave surfaces of the STI regions 72. As such, the bottom surfaces of the dummy gates 76 extend away from the nanostructures 64, 66 a first distance $D_1$, and the outer sidewalls of the dummy gates 76 are disposed a second distance $D_2$ from the nanostructures 64, 66, with the first distance $D_1$ being less than or equal to (e.g., not greater than) the second distance $D_2$. The first distance $D_1$ is measured below the top surface of the semiconductor fins 62, and the second distance $D_2$ between the top surface of the semiconductor fins 62 and the bottom surface of the bottom nanostructure 66. The dimensions of the first distance $D_1$ and the second distance $D_2$ will be subsequently described in greater detail. Forming the dummy gates 76 with a small footing profile increases the processing window for subsequent operations, such as a replacement gate process and/or an epitaxial growth process for source/drain regions.

FIGS. 7A-9C are views of intermediate stages in the patterning of dummy gates 76 with a small footing profile, in accordance with some embodiments. The dummy gates 76 are formed with a small footing profile by patterning the dummy gate layer 74 with multiple etching processes. Specifically, a first etching process is performed to initially pattern the dummy gate layer 74 into the dummy gates 76 (see FIGS. 7A-7B). Protective layers 80 are formed along the upper portions 76U of the dummy gates 76 (see FIGS. 7A-7B), with the lower portions 76L of the dummy gates 76 remaining exposed by the protective layers 80. A second etching process is then performed to trim the lower portions 76L of the dummy gates 76 while the upper portions 76U of the dummy gates 76 are covered by the protective layers 80 (see FIGS. 8A-8C). Trimming the lower portions 76L of the dummy gates 76 reduces the footing profile of the dummy gates 76 by reducing the widths of the lower portions 76L of the dummy gates 76. The protective layers 80 may optionally be removed (see FIGS. 9A-9C).

Figure 7A:
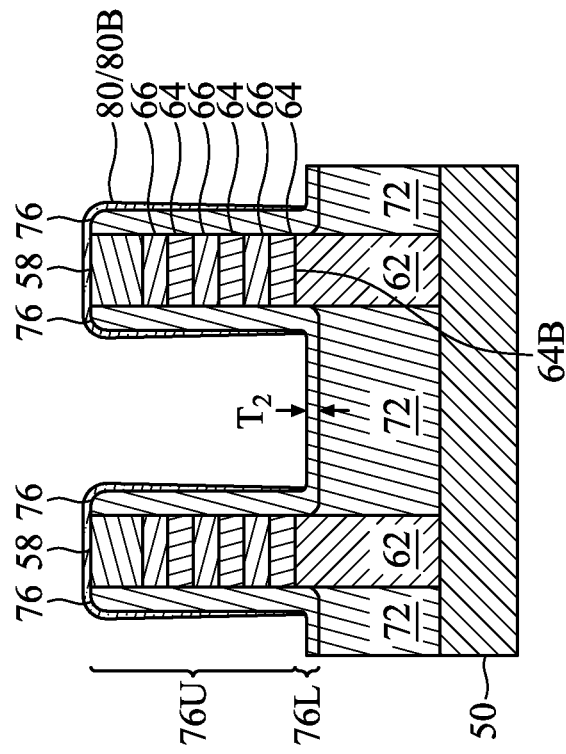
Figure 7B:
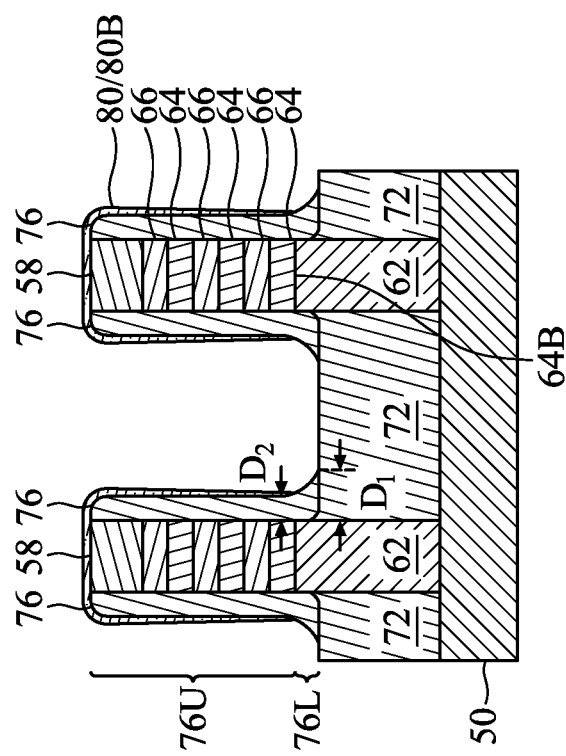

In FIGS. 7A-7B, a first etching process is performed to initially pattern the dummy gate layer 74 (see FIGS. 5A-5B) into the dummy gates 76. The first etching process may be a dry etch, a wet etch, the like, or a combination thereof. The first etching process may be anisotropic. The portions of the dummy gate layer 74 over the mask 58 (if present) or the nanostructures 64, 66 are removed by the first etching process.

The areal density of the nanostructures 64, 66 determines the outcome of the first etching process, such as by influencing loading during the first etching process. The dummy gates 76 along nanostructures 64, 66 in sparse regions may be patterned so that the STI regions 72 between the nanostructures 64, 66 are exposed, as illustrated by FIG. 7A. The dummy gates 76 along nanostructures 64, 66 in dense regions may be patterned so that the STI regions 72 between the nanostructures 64, 66 are covered, as illustrated by FIG. 7B. In some embodiments, the critical dimension (CD) between the nanostructures 64, 66 is in the range of 2 nm to 2000 nm, where a sparse region refers to a region where the CD is near the lower limit of this range, and a dense region refers to a region where the CD is near the upper limit of this range. A same substrate 50 may have sparse regions and dense regions, such that the first etching process forms the structures of FIGS. 7A and 7B on a same substrate 50.

The first etching process forms the dummy gates 76 with a large footing profile. Forming the dummy gates 76 with a large footing profile refers to forming the dummy gates 76 so that the portions of the dummy gates 76 on the top surfaces of the STI regions 72 flare outward along the concave surfaces of the STI regions 72. In other words, the sidewalls of the dummy gates 76 are spaced apart by a distance that increases in a direction extending from the top of the dummy gates 76 to the bottom of the dummy gates 76. Referring to FIG. 7A, when the dummy gates 76 are patterned so that the STI regions 72 between the nanostructures 64, 66 are exposed, the first distance $D_1$ is greater than the second distance $D_2$. In this embodiment, the portions of the dummy gate layer 74 over the STI regions 72 are removed. Referring to FIG. 7B, when the dummy gates 76 are patterned so that the STI regions 72 between the nanostructures 64, 66 are covered, the dummy gates 76 extend across the concave surfaces of the STI regions 72. In this embodiment, the portions of the dummy gate layer 74 over the STI regions 72 are thinned. As such, the thickness $T_1$ of the dummy gates 76 over the STI regions 72 is reduced after the first etching process. After the first etching process, the dummy gate layer 74 can have a thickness $T_2$ over the STI regions 72 in the range of 0.3 nm to 20 nm, with the thickness $T_2$ being less than the thickness $T_1$.

Further, protective layers 80 are formed along the upper portions 76U of the dummy gates 76 and over the mask 58 (if present) or the nanostructures 64, 66. In this embodiment, the protective layers 80 are not formed along the lower portions 76L of the dummy gates 76, such that the lower portions 76L of the dummy gates 76 are exposed and can be subsequently trimmed. The protective layers 80 are also not formed along the portions of the dummy gates 76 covering the top surfaces of the STI regions 72 (see FIG. 7B), so that those portions of the dummy gates 76 are exposed and can be subsequently removed during the trimming. In this context, the upper portions 76U of the dummy gates 76 refers to the portions that have straight sidewalls spaced apart by a constant distance and a rounded top surface, and the lower portions 76L of the dummy gates 76 refers to the portions that flare outward along the STI regions 72. In some embodiments, the lower portion 76L of each dummy gate 76 is disposed beneath the bottom surface 64B of the nanostructure(s) 64/66 that are adjacent that dummy gate 76 and disposed the closest to (and over) the STI regions 72. In some embodiments, the upper portion 76U of each dummy gate 76 is disposed above the bottom surface 64B of the nanostructure(s) 64/66.

In this embodiment, the protective layers 80 are byproduct layers 80B produced by the first etching process for patterning the dummy gate layer 74. The byproduct layers 80B are formed by including a passivation gas with the etchants used during the first etching process. The passivation gas controls the selectivity of the first etching process and promotes production of etching byproducts, thus leaving behind the byproduct layers 80B after the first etching process. The byproduct layers 80B can have a thickness in the range of 2 Å to 150 Å. The byproduct layers 80B may have an upper thickness that is greater than a lower thickness along the sidewall of the dummy gates 76, such that the byproduct layers 80B have an inverted trapezoid profile shape. Forming the byproduct layers 80B with such a thickness and shape protects the upper portions 76U of the dummy gates 76 when the lower portions 76L of the dummy gates 76 are subsequently trimmed. Forming the byproduct layers 80B without such a thickness or shape may not protect the upper portions 76U of the dummy gates 76 when the lower portions 76L of the dummy gates 76 are subsequently trimmed.

In some embodiments, the first etching process is a dry etch performing with a gas source that includes a main etching gas and a passivation gas. The main etching gas may be $Cl_2$, $HBr$, $CF_4$, $CHF_3$, $CH_2F_2$, $CH_3F$, $C_4F_6$, $BCl_3$, $SF_6$, $H_2$, or the like. The passivation gas may be $N_2$, $O_2$, $CO_2$, $SO_2$, CO, $CH_4$, $SiCl_4$, or the like. In some embodiments, the gas source also includes a dilute gas such as Ar, He, Ne, or the like. A plasma is generated during the first etching process. In some embodiments, the first etching process is implemented cyclically. For example, first etching process may include cycling between dispensing the main etching gas and dispensing the passivation gas. The etching cycle can be repeated up to 50 times. In some embodiments, the process conditions of the first etching process include: a pressure in the range of 1 mTorr to 800 mTorr; a plasma source power (configured to control the ratio of ions to radicals) in the range of 10 W to 3000 W; a plasma bias power (configured to control the etch direction (e.g., isotropic etch or anisotropic etch)) in the range of 0 W to 3000 W; and a gas source flow rate in the range of 1 sccm to 5000 sccm. Performing the first etching process with parameters in these ranges allows the byproduct layers 80B to be formed with a desired thickness and shape (previously described).

The composition of the byproduct layers 80B depends on the passivation gas utilized in the first etching process. Continuing the example where the dummy gate layer 74 is formed of silicon or silicon germanium: the byproduct layers 80B may be SiO or SiGeO byproducts formed when using an oxygen-based passivation gas (e.g., $O_2$, $CO_2$, $SO_2$, CO, or the like); the byproduct layers 80B may be SiN or SiGeN byproducts formed when using a nitrogen-based passivation gas (e.g., $N_2$ or the like); and the byproduct layers 80B may be SiS or SiGeS byproducts formed when using a sulfur-based passivation gas (e.g., $SO_2$ or the like). In some embodiments, a plurality of passivation gases may be utilized in the first etching process. For example, a mixture of an oxygen-based passivation gas, a nitrogen-based passivation gas, and a sulfur-based passivation gas (e.g., $SO_2$ and $N_2$) may be utilized in the first etching process, and the byproduct layers 80B may be $SiGeS_xO_yN_z$ byproducts.

Figure 8A:
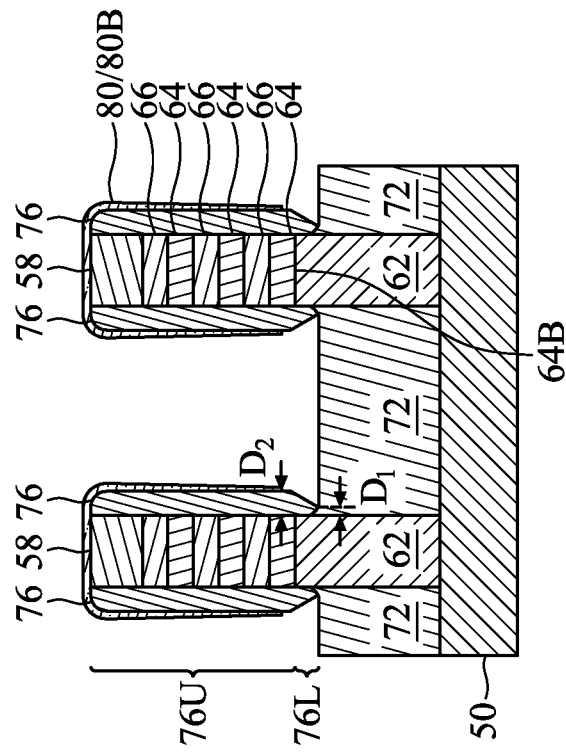
Figure 8B:
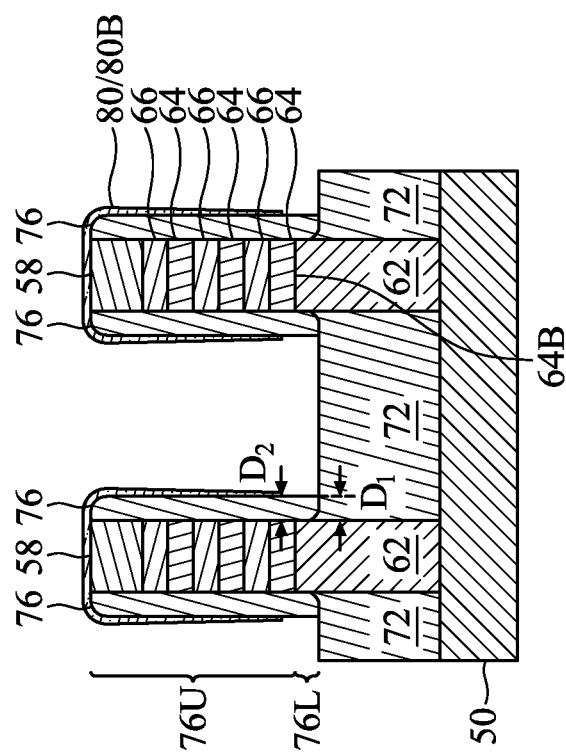
Figure 8C:
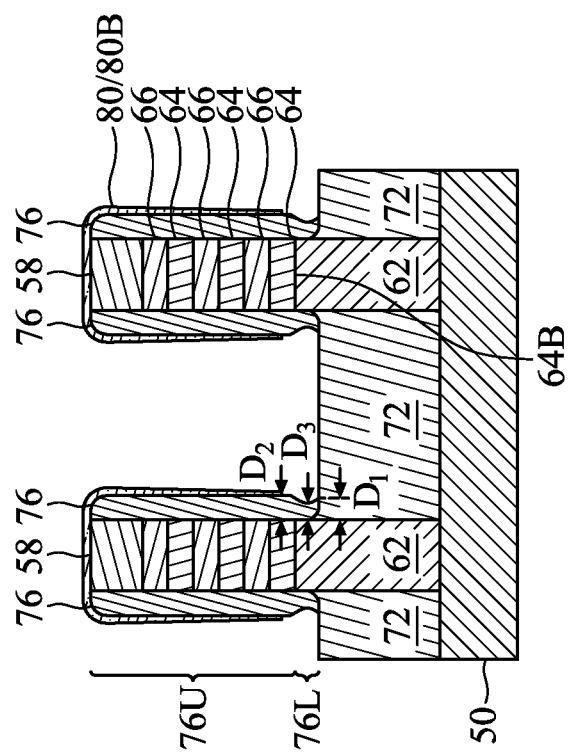

In FIGS. 8A-8C, a second etching process is performed to trim the lower portions 76L of the dummy gates 76 while the upper portions 76U of the dummy gates 76 are covered by the protective layers 80. The second etching process may be a wet clean, and reduces the footing profile of the dummy gates 76 by reducing the widths of the lower portions 76L of the dummy gates 76. Specifically, the second etching process laterally etches the lower portions 76L of the dummy gates 76 until the dummy gates 76 have a small footing profile. The second etching process can have a greater lateral etch rate than the first etching process, and can have a lesser vertical etch rate than the first etching process, allowing the second etching process to be a trimming process. In embodiments where the dummy gates 76 cover the STI regions 72 between the nanostructures 64, 66 (see FIG. 7B), the second etching process also exposes the top surfaces of the STI regions 72. The protective layers 80 act as etch stop layers during the second etching process, to protect the upper portions 76U of the dummy gates 76 so that they are not trimmed during the second etching process. In other words, the lower portions 76L of the dummy gates 76 are etched during the second etching process, and the upper portions 76U of the dummy gates 76 are not etched (or at least are less etched than the lower portions 76L of the dummy gates 76) during the second etching process. In some embodiments, the first distance $D_1$ is equal to the second distance $D_2$ after the second etching process, as illustrated by FIG. 8A. In some embodiments, the first distance $D_1$ is less than the second distance $D_2$ after the second etching process, as illustrated by FIGS. 8B and 8C.

In some embodiments, the second etching process is a wet etch performing with a main etching chemical and an assistant etching chemical in a solvent. The main etching chemical may be HF, $F_2$, or the like. The assistant etching chemical may be $O_3$, $H_2SO_4$, HCl, HBr, or the like. The solvent may be deionized (DI) water, alcohol, acetone, or the like.

The structure of FIG. 8A can be obtained by performing the second etching process on the structure of FIG. 7A, e.g., by patterning the dummy gates 76 so that the STI regions 72 between the nanostructures 64, 66 are exposed, and then by trimming the lower portions 76L of the dummy gates 76. For example, the second etching process can be controlled (e.g., by adjusting the plasma bias power) so that it etches in a lateral direction that is substantially parallel to the major surface of the substrate 50. In this embodiment, the sidewalls of the lower portions 76L of the dummy gates 76 are spaced apart by a distance that is constant in a direction extending from the top of the dummy gates 76 to the bottom of the dummy gates 76. The sidewalls of the lower portions 76L of the dummy gates 76 are thus substantially perpendicular to the major surface of the substrate 50.

The structure of FIG. 8B can be obtained by performing the second etching process on the structure of FIG. 7A, e.g., by patterning the dummy gates 76 so that the STI regions 72 between the nanostructures 64, 66 are exposed, and then by trimming the lower portions 76L of the dummy gates 76. For example, the second etching process can be controlled (e.g., by adjusting the plasma bias power) so that it etches in a lateral direction that is substantially parallel to the major surface of the substrate 50. The dummy gates 76 in the embodiment of FIG. 8B can be etched more than the embodiment of FIG. 8A, thereby causing them to flare inward along the STI regions 72. In this embodiment, the sidewalls of the lower portions 76L of the dummy gates 76 are spaced apart by a distance that decreases linearly in a direction extending from the top of the dummy gates 76 to the bottom of the dummy gates 76. The sidewalls of the lower portions 76L of the dummy gates 76 thus form acute angles with a plane that is parallel to the major surface of the substrate 50.

The structure of FIG. 8C can be obtained by performing the second etching process on the structure of FIG. 7B, e.g., by patterning the dummy gates 76 so that the STI regions 72 between the nanostructures 64, 66 are covered, and then by trimming the lower portions 76L of the dummy gates 76 so that the STI regions 72 are exposed. For example, the second etching process can be controlled (e.g., by adjusting the plasma bias power) so that it etches in a diagonal direction that forms an acute angle with a plane that is parallel to the major surface of the substrate 50. In this embodiment, the sidewalls of the lower portions 76L of the dummy gates 76 are spaced apart by a distance that decreases non-linearly in a direction extending from the top of the dummy gates 76 to the bottom of the dummy gates 76, and then also increases non-linearly in that direction. When the dummy gates 76 have portions covering the STI regions 72 (see FIG. 7B), the etching of those portions can reduce the lateral etching of the second etching process. The sidewalls of the lower portions 76L of the dummy gates 76 may thus include sidewall recesses 76R. The bottoms of the sidewall recesses 76R are disposed a third distance $D_3$ from the nanostructures 64, 66, with the third distance $D_3$ being less than the second distance $D_2$ and the first distance $D_1$. The third distance $D_3$ is measured between the points where the second distance $D_2$ and the first distance $D_1$ are measured.

Figure 9A:
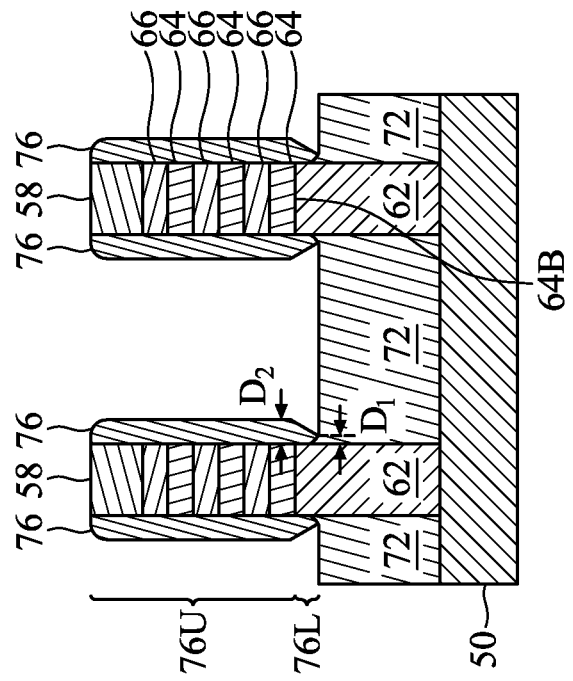
Figure 9B:
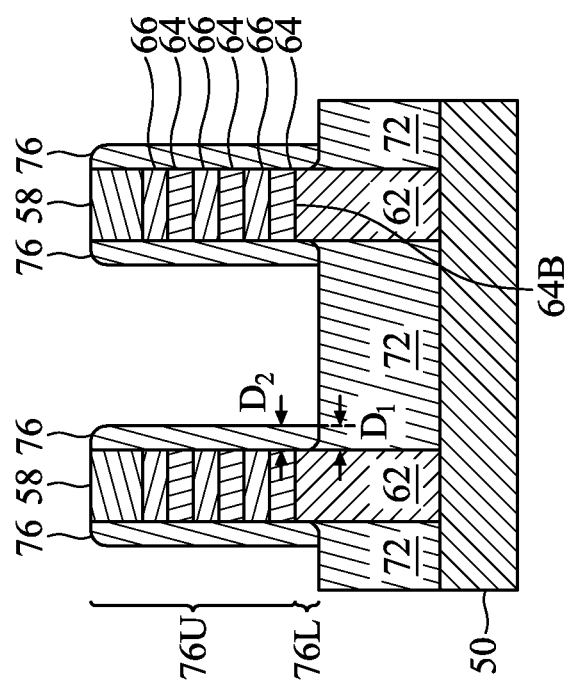
Figure 9C:
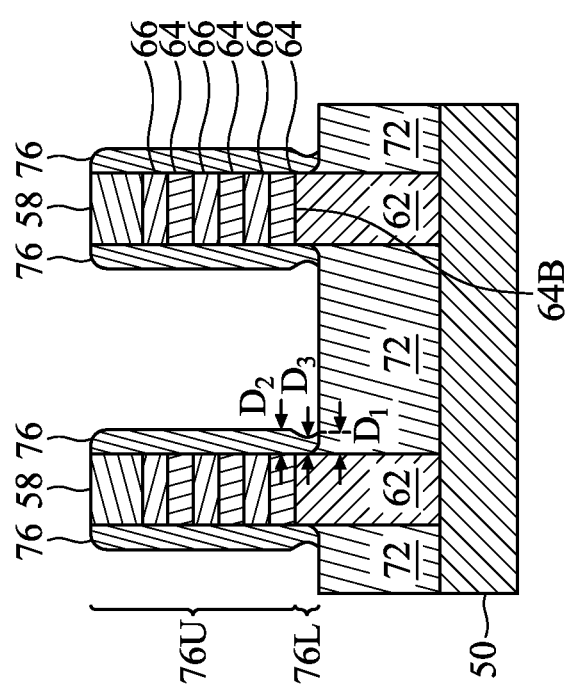

In FIGS. 9A-9C, the protective layers 80 are optionally removed. In some embodiments, the protective layers 80 are removed by a wet clean performed after the lower portions 76L of the dummy gates 76 are trimmed. In some embodiments, the protective layers 80 are removed by the second etching process for trimming the lower portions 76L of the dummy gates 76. In other embodiments (subsequently described), the protective layers 80 are not removed, and remain in the final devices.

FIGS. 10A-22C are shown for the embodiment of FIG. 9A. Further, the protective layers 80 are removed in the illustrated embodiment. It should be appreciated that a similar process could be performed using the embodiments of FIG. 8A-8C or 9B-9C.

Figure 10A:
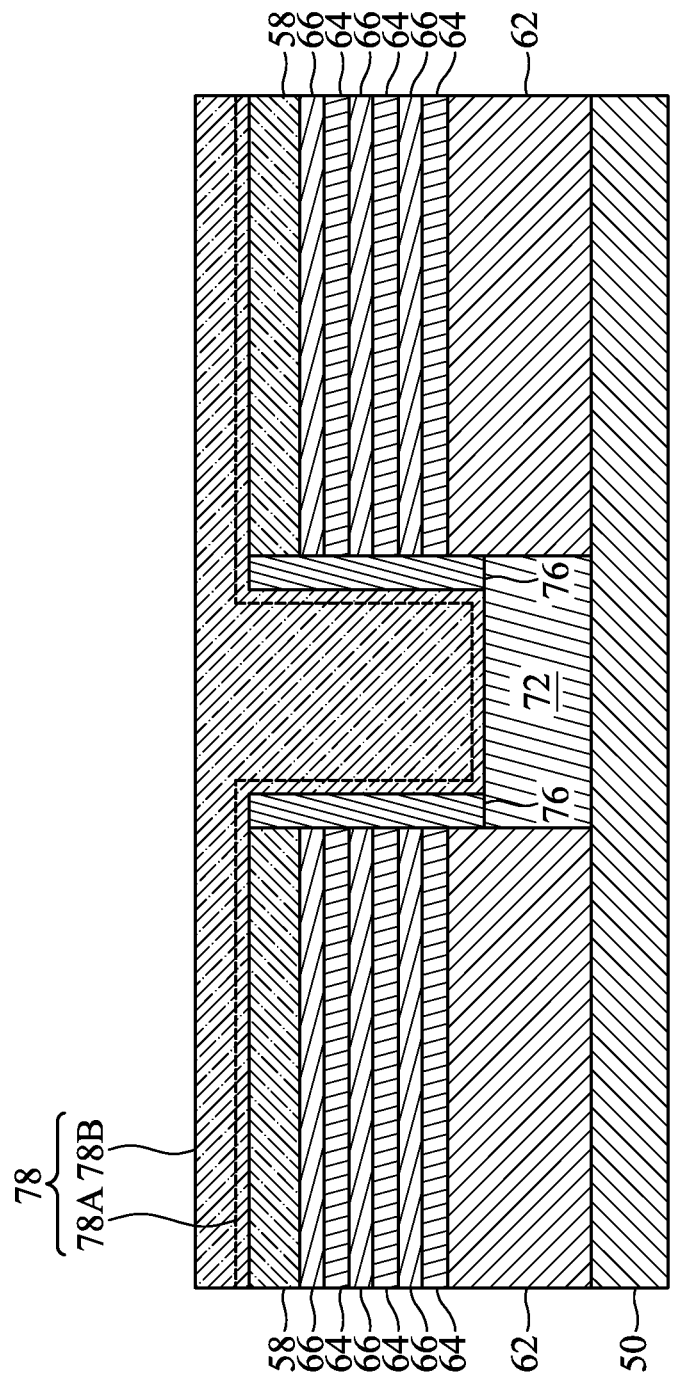
Figure 10C:
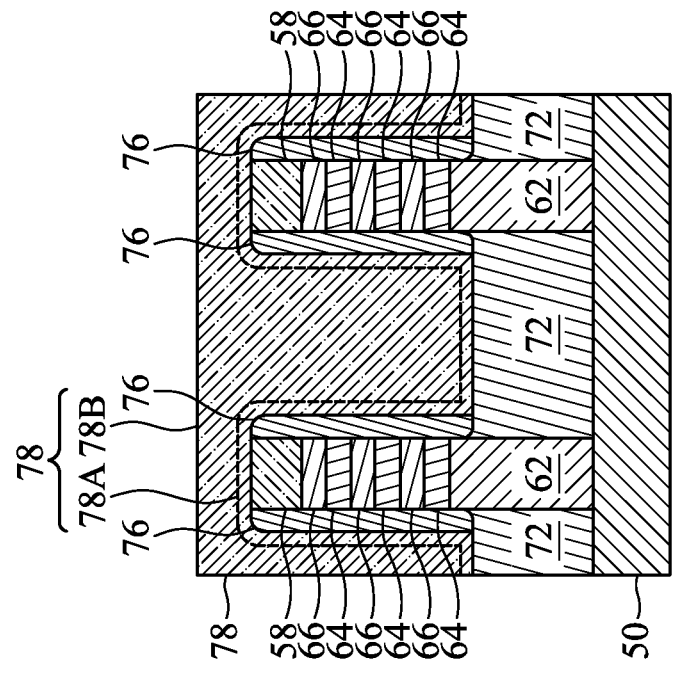
Figure 10B:
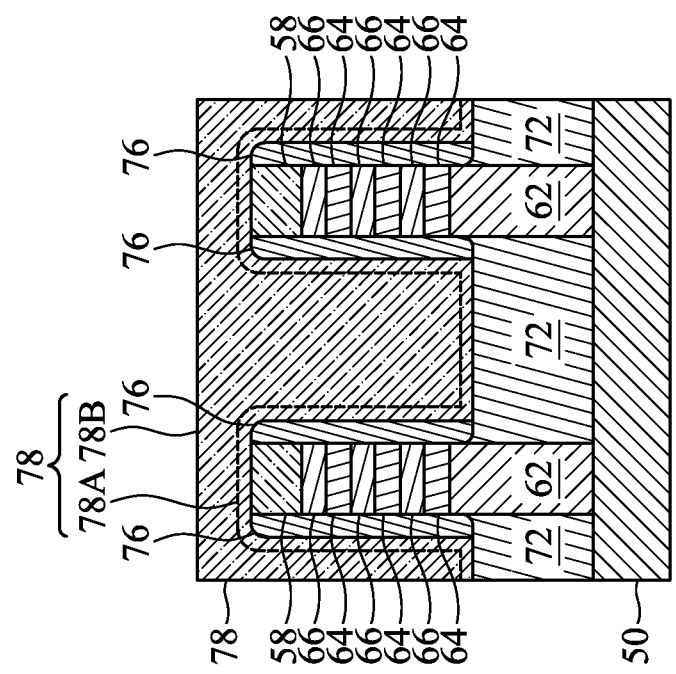

In FIGS. 10A-10C, a hybrid fin layer 78 is conformally formed over the mask 58 (if present), the semiconductor fins 62, the nanostructures 64, 66, and the dummy gates 76. The hybrid fin layer 78 is formed of one or more dielectric material(s) having a high etching selectivity from the etching of the semiconductor fins 62, the nanostructures 64, 66, and the dummy gates 76. Acceptable dielectric materials may include silicon oxide, silicon nitride, silicon oxynitride, silicon oxycarbonitride, silicon carbonitride, a metal-based dielectric material, combinations thereof, or the like, which may be formed by a conformal deposition process such as low-pressure chemical vapor deposition (LPCVD), plasma-enhanced chemical vapor deposition (PECVD), flowable chemical vapor deposition (FCVD), or the like. Other insulation materials formed by any acceptable process may be used. In some embodiments, the hybrid fin layer 78 is formed of a low-k dielectric material (e.g., a dielectric material having a k-value less than about 3.5), such as fluorosilicate glass (FSG). The hybrid fin layer 78 fills the remaining area between the semiconductor fins 62 and the nanostructures 64, 66 that is not filled by the dummy gates 76, and may be formed over the top surfaces of the mask 58 (if present) or the nanostructures 64, 66. In some embodiments, the hybrid fin layer 78 includes multiple sub-layers, e.g., a liner layer 78A and a fill layer 78B, which may be formed of different materials.

Figure 11A:
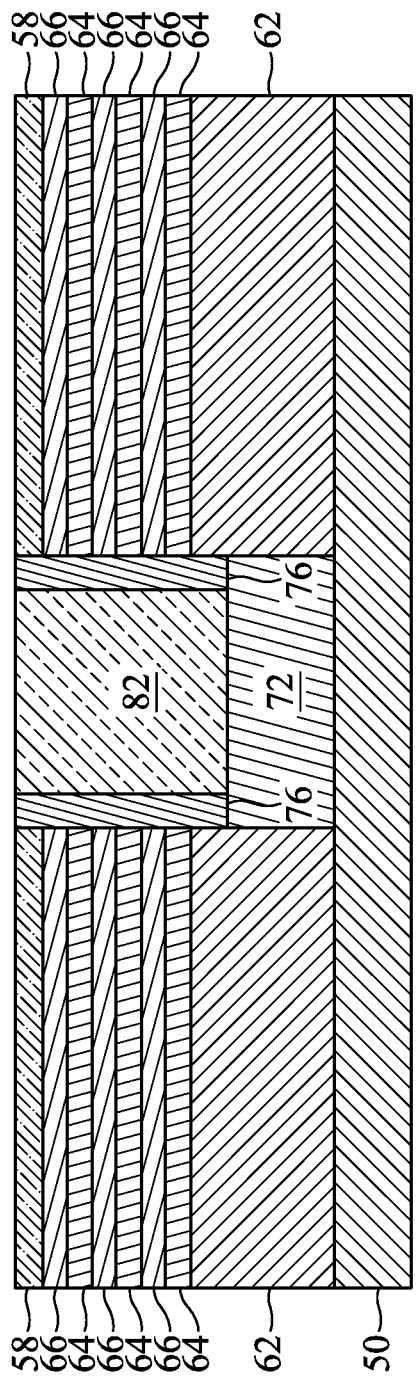
Figure 11C:
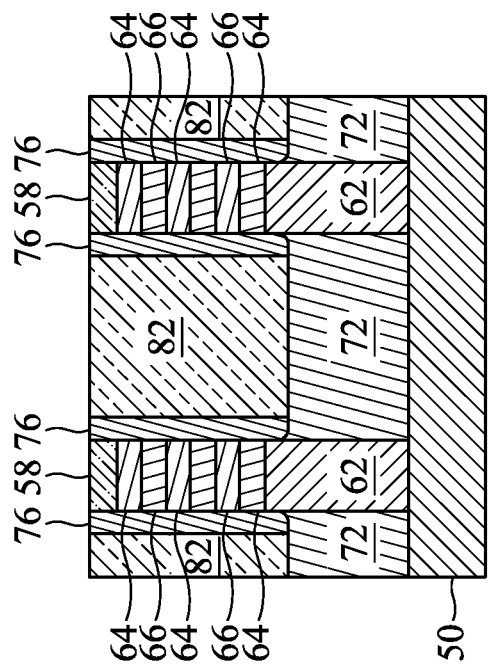
Figure 11B:
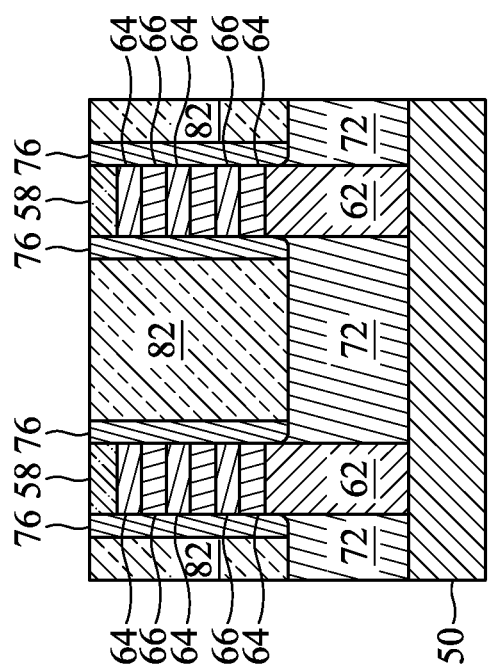

In FIGS. 11A-11C, a removal process is performed to remove the excess portions of the material(s) of the hybrid fin layer 78, which excess portions are over the top surfaces of the mask 58 (if present) or the nanostructures 64, 66, thereby forming hybrid fins 82. In some embodiments, a planarization process such as a chemical mechanical polish (CMP), an etch-back process, combinations thereof, or the like may be utilized. The hybrid fin layer 78, when planarized, has portions left in the area between the semiconductor fins 62 and the nanostructures 64, 66 (thus forming the hybrid fins 82). After the planarization process, the top surfaces of the hybrid fins 82, the dummy gates 76, and the mask 58 (if present) or the nanostructures 64, 66 are coplanar (within process variations).

In embodiments in which a mask 58 remains on the nanostructures 64, 66, the removal process may expose the mask 58 or remove the mask 58. Further, in some embodiments, the mask 58 is removed by a separate process that is performed after the removal process. Any acceptable etch process, such as a dry etch, a wet etch, the like, or a combination thereof, may be performed to remove the mask 58. The etching may be anisotropic. In some embodiments where the mask 58 is removed, the removal process may (or may not) also recess the dummy gates 76.

Figure 12A:
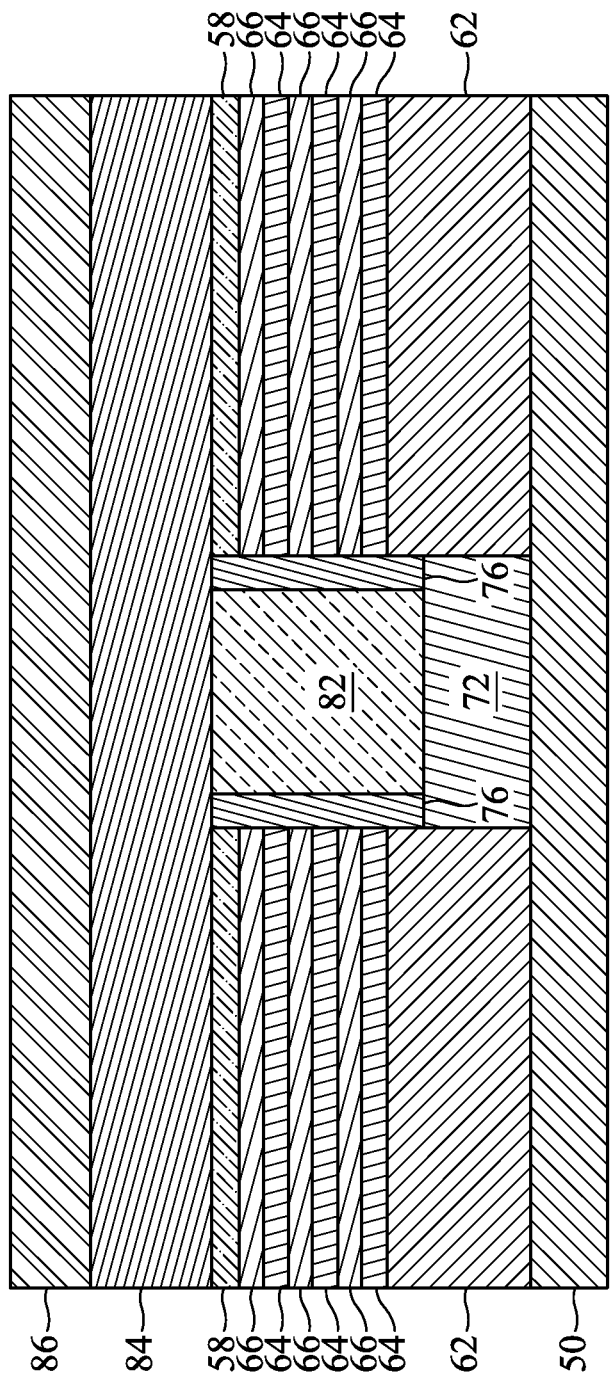
Figure 12C:
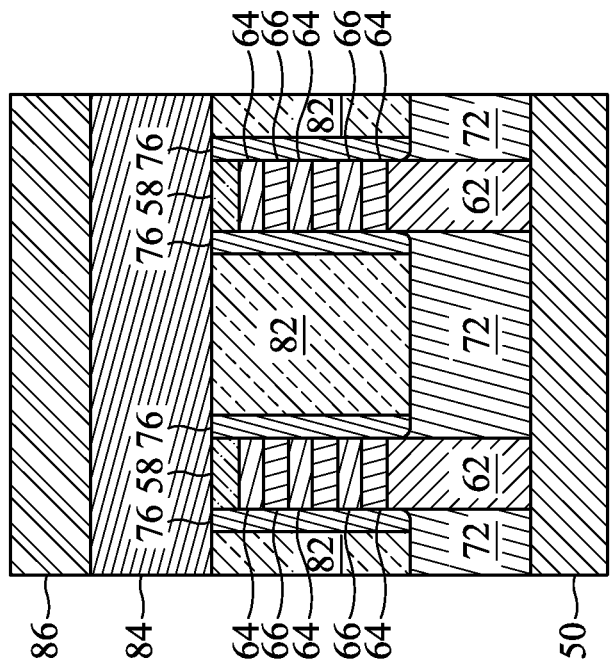
Figure 12B:
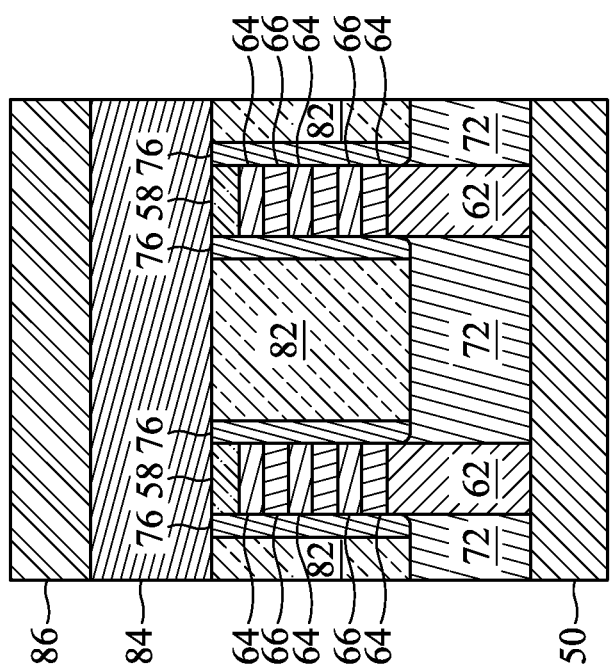

In FIG. 12A-12C, a dummy gate layer 84 is formed on the hybrid fins 82, the dummy gates 76, and the mask 58 (if present) or the nanostructures 64, 66. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the hybrid fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 13A:
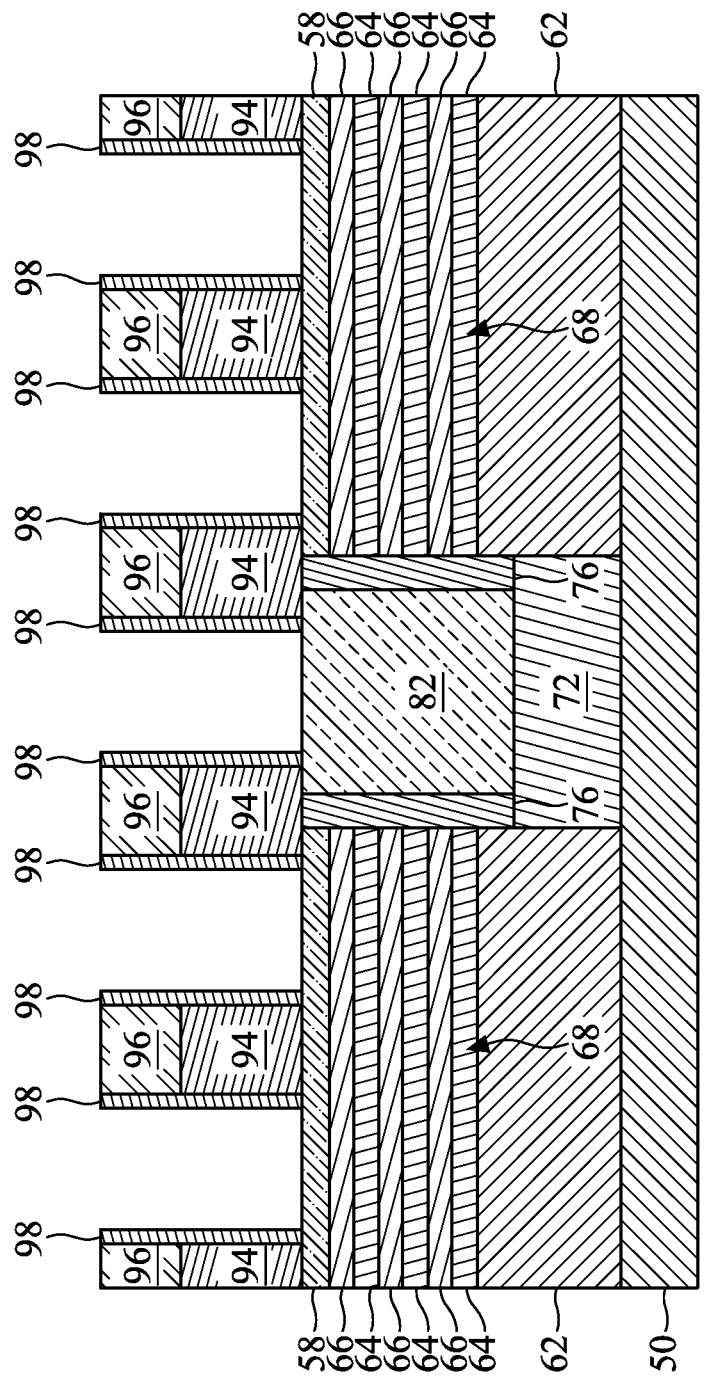
Figure 13C:
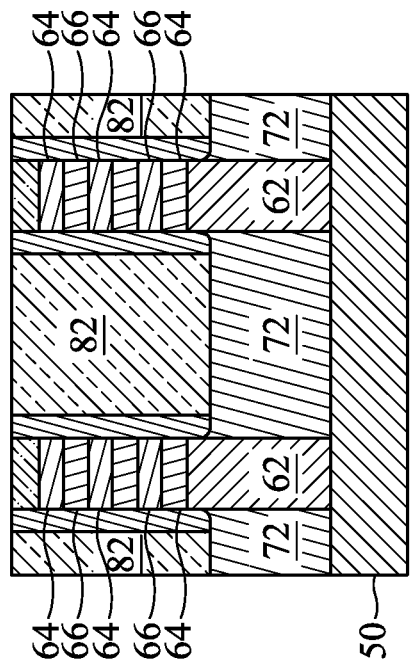
Figure 13B:
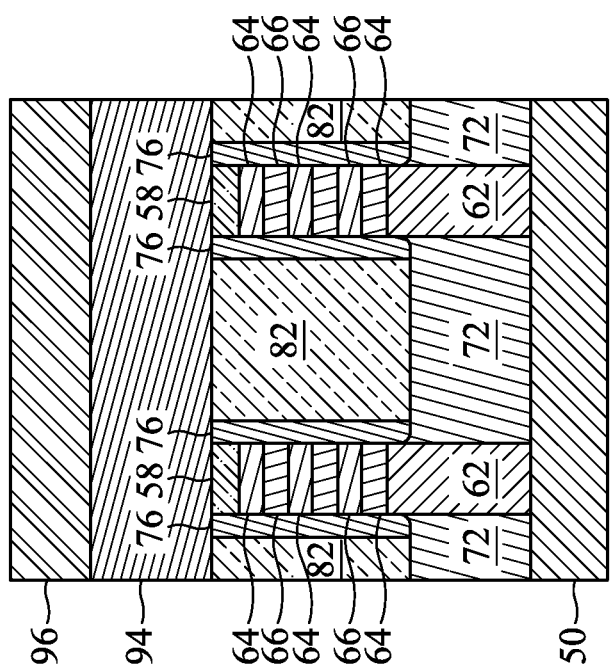

In FIGS. 13A-13C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surface of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The dummy gates 76 and the dummy gates 94 collectively extend along the portions of the nanostructures 66 that will be patterned to form channel regions 68. Subsequently formed gate structures will replace the dummy gates 76 and the dummy gates 94. Forming the dummy gates 94 over the dummy gates 76 allows the subsequently formed gate structures to have a greater height.

As noted above, the dummy gates 94 may be formed of a semiconductor material. In such embodiments, the nanostructures 64, the dummy gates 76, and the dummy gates 94 are each formed of semiconductor materials. In some embodiments, the nanostructures 64 and the dummy gates 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the dummy gates 76 may be removed together in a second etching step. When the nanostructures 64 and the dummy gates 76 are formed of silicon germanium: the nanostructures 64 and the dummy gates 76 may have similar germanium concentrations, the nanostructures 64 may have a greater germanium concentration than the dummy gates 76, or the dummy gates 76 may have a greater germanium concentration than the nanostructures 64. In some embodiments, the nanostructures 64 are formed of a first semiconductor material (e.g., silicon germanium) and the dummy gates 76 and the dummy gates 94 are formed of a second semiconductor material (e.g., silicon), so that during a replacement gate process, the dummy gates 76 and the dummy gates 94 may be removed together in a first etching step, and the nanostructures 64 may be removed in a second etching step.

Further, gate spacers 98 are formed over the mask 58 (if present) or the nanostructures 64, 66, and on exposed sidewalls of the masks 96 (if present) and the dummy gates 94. The gate spacers 98 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 14A:
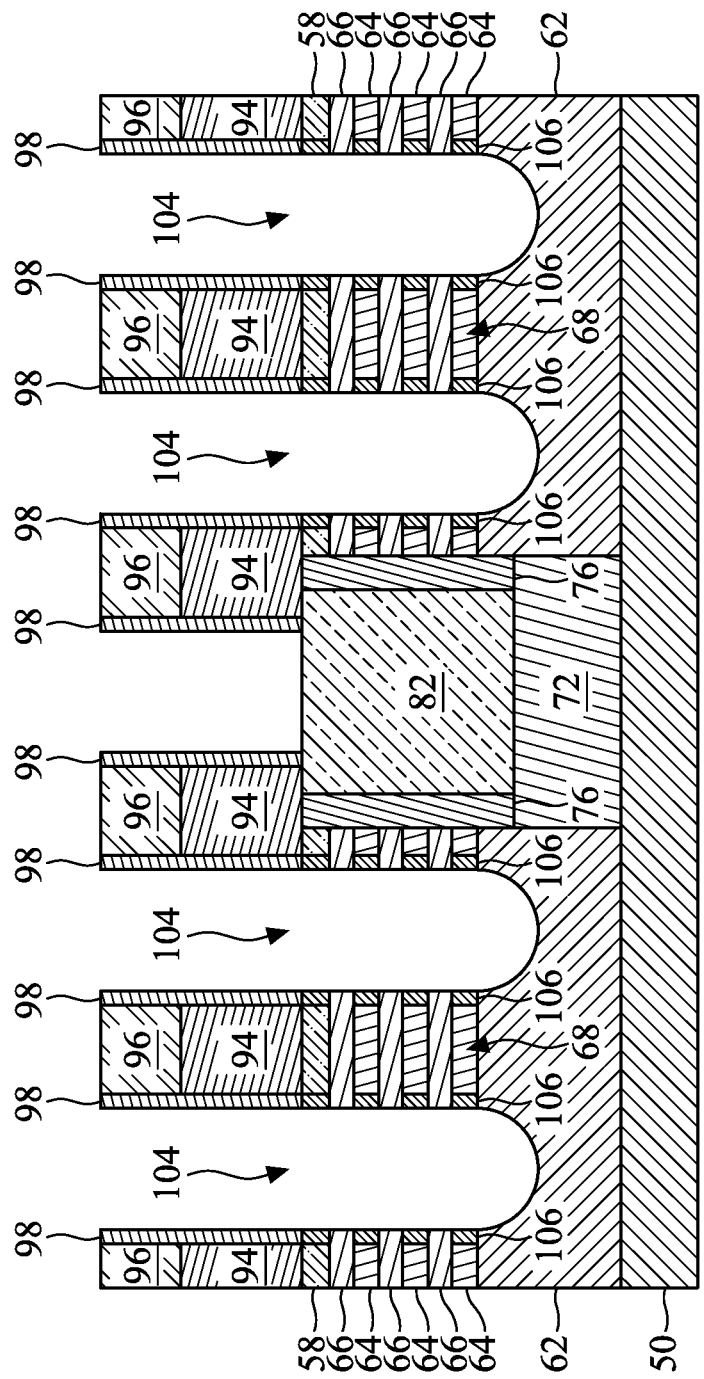
Figure 14C:
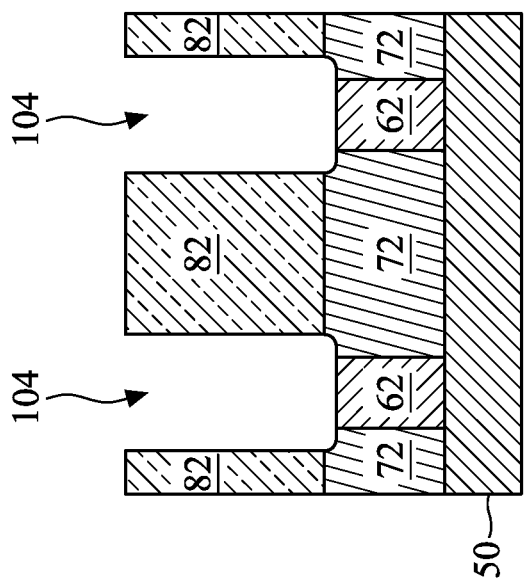
Figure 14B:
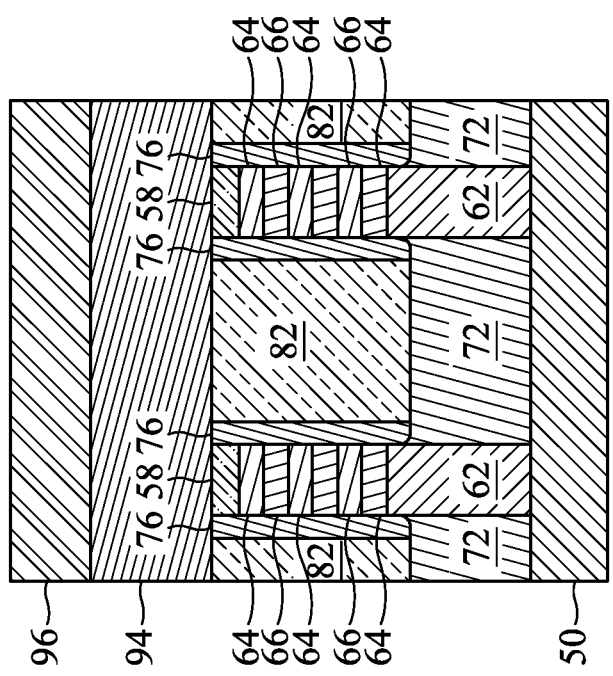

In FIGS. 14A-14C, source/drain recesses 104 are formed in the mask 58 (if present), the nanostructures 64, 66, and the dummy gates 76. In the illustrated embodiment, the source/drain recesses 104 extend through the nanostructures 64, 66 and into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the dummy gates 76 using an anisotropic etching processes, such as a RIE, a NBE, or the like. The gate spacers 98 and the dummy gates 94 collectively mask portions of the semiconductor fins 62 and/or the nanostructures 64, 66 during the etching processes used to form the source/drain recesses 104. A single etch process may be used to etch each of the nanostructures 64, 66, or multiple etch processes may be used to etch the nanostructures 64, 66. Timed etch processes may be used to stop the etching of the source/drain recesses 104 after the source/drain recesses 104 reach a desired depth. In some embodiments, portions of the STI regions 72 adjacent the hybrid fins 82 may also be etched during the formation of the source/drain recesses 104.

Because the dummy gates 76 have a small footing profile, they may be more easily removed, without residue of the dummy gates 76 remaining on the top surface of the STI regions 72. More area may thus be available for source/drain regions, and the source/drain regions may be formed so that no residue of the dummy gates 76 remains beneath them. Etching of the subsequently formed source/drain regions during a replacement gate process may thus be avoided, thereby increasing manufacturing yield.

Optionally, inner spacers 106 are formed on the sidewalls of the remaining portions of the mask 58 (if present) and the nanostructures 64, e.g., those sidewalls exposed by the source/drain recesses 104. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being straight, the sidewalls may be concave or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being flush with respect to the sidewalls of the gate spacers 98, the outer sidewalls of the inner spacers 106 may extend beyond or be recessed from the sidewalls of the gate spacers 98. In other words, the inner spacers 106 may partially fill, completely fill, or overfill the sidewall recesses. Moreover, although the sidewalls of the inner spacers 106 are illustrated as being straight, the sidewalls of the inner spacers 106 may be concave or convex. Portions of the sidewalls of the mask 58 (if present) may also be recessed, and the inner spacers 106 can also be formed on the recessed sidewalls of the mask 58.

Figure 15A:
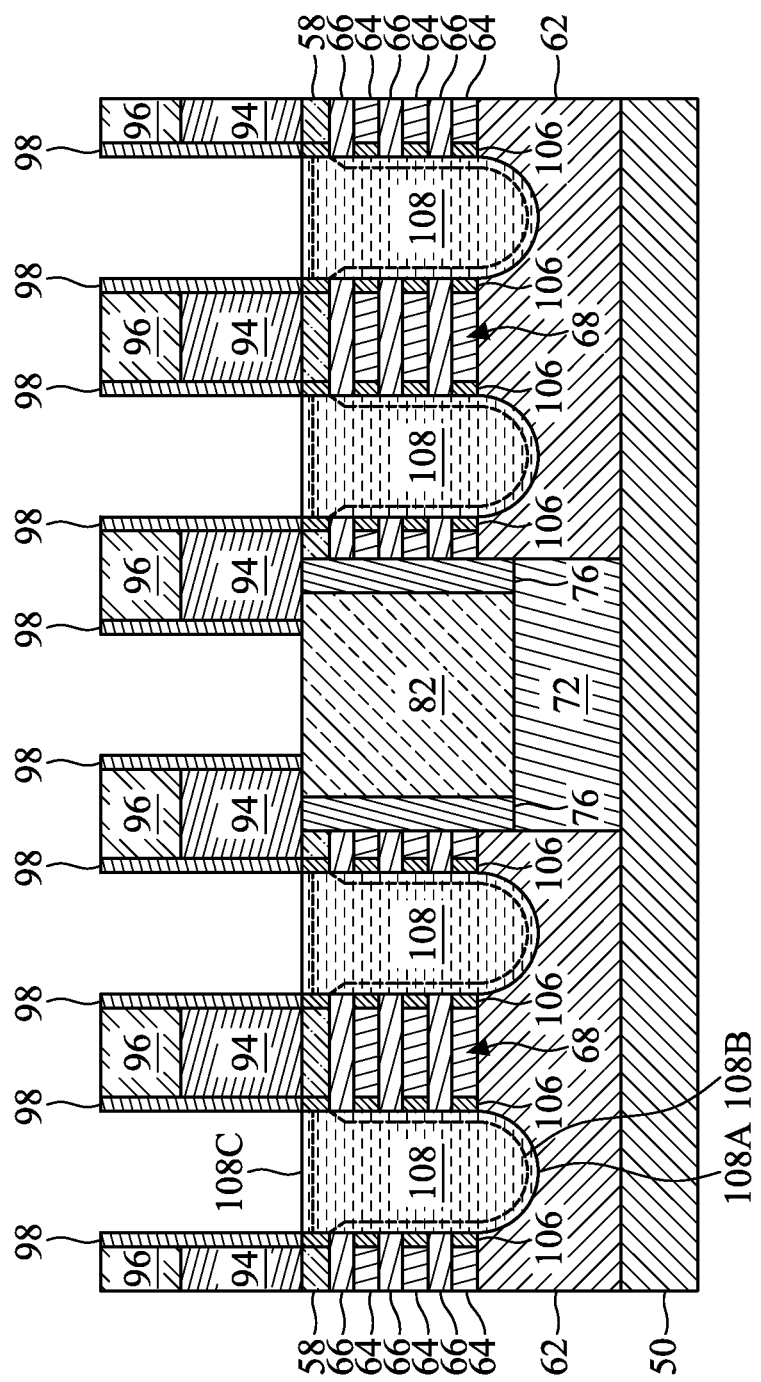
Figure 15C:
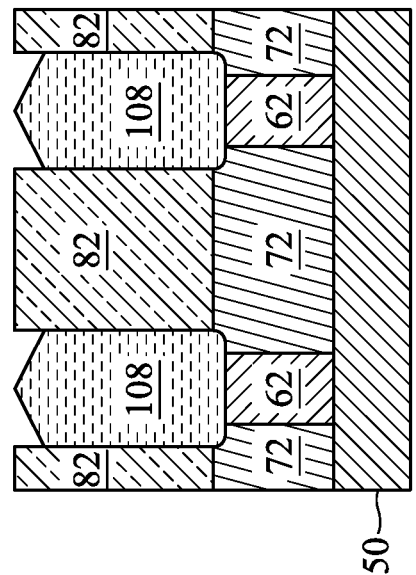
Figure 15B:
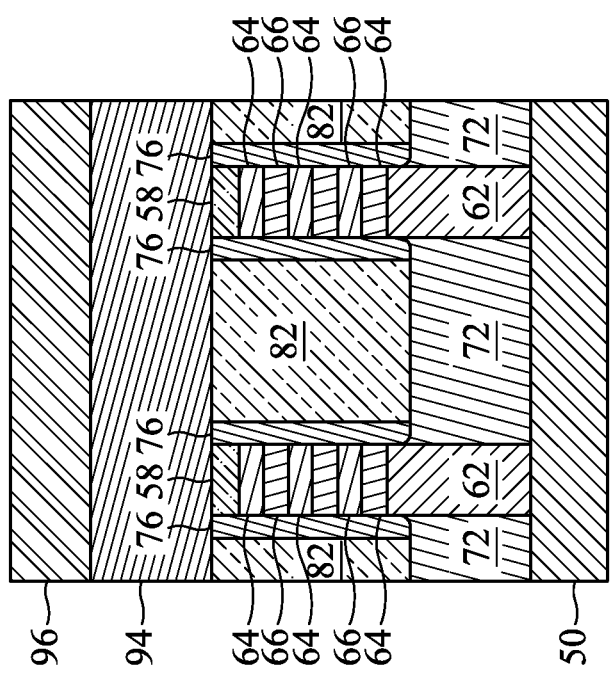

In FIGS. 15A-15C, epitaxial source/drain regions 108 are formed in the source/drain recesses 104. The epitaxial source/drain regions 108 are formed in the source/drain recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nanostructure transistors/FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nanostructures 66 are silicon, the epitaxial source/drain regions 108 in the n-type region 50N may include materials exerting a tensile strain on the channel regions 68, such as silicon, silicon carbide, phosphorous doped silicon carbide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nanostructures 66 are silicon, the epitaxial source/drain regions 108 in the p-type region 50P may include materials exerting a compressive strain on the channel regions 68, such as silicon germanium, boron doped silicon germanium, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A, a main layer 108B, and a finishing layer 108C (or more generally, a first semiconductor material layer, a second semiconductor material layer, and a third semiconductor material layer). Any number of semiconductor material layers may be used for the epitaxial source/drain regions 108. Each of the liner layer 108A, the main layer 108B, and the finishing layer 108C may be formed of different semiconductor materials and may be doped to different impurity concentrations. In some embodiments, the liner layer 108A may have a lesser concentration of impurities than the main layer 108B, and the finishing layer 108C may have a greater concentration of impurities than the liner layer 108A and a lesser concentration of impurities than the main layer 108B. In embodiments in which the epitaxial source/drain regions 108 include three semiconductor material layers, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, top surfaces of the epitaxial source/drain regions have facets which expand laterally outward beyond sidewalls of the semiconductor fins 62 and the nanostructures 64, 66. However, the hybrid fins 82 block the lateral epitaxial growth. Therefore, adjacent epitaxial source/drain regions 108 remain separated after the epitaxy process is completed as illustrated by FIG. 15C. The epitaxial source/drain regions 108 contact the sidewalls of the hybrid fins 82. In the illustrated embodiment, the epitaxial source/drain regions 108 are grown so that the top surfaces of the epitaxial source/drain regions 108 are disposed below the top surfaces of the hybrid fins 82. In various embodiments, the top surfaces of the epitaxial source/drain regions 108 are disposed above the top surfaces of the hybrid fins 82; the top surfaces of the epitaxial source/drain regions 108 have portions disposed above and below the top surfaces of the hybrid fins 82; or the like. Further, in the illustrated embodiment, the epitaxial source/drain regions 108 are grown so that the top surfaces of the epitaxial source/drain regions 108 are coplanar with the top surfaces of the nanostructures 64, 66. In another embodiment, the epitaxial source/drain regions 108 are grown so that the top surfaces of the epitaxial source/drain regions 108 are disposed above the top surfaces of the nanostructures 64, 66.

Figure 16A:
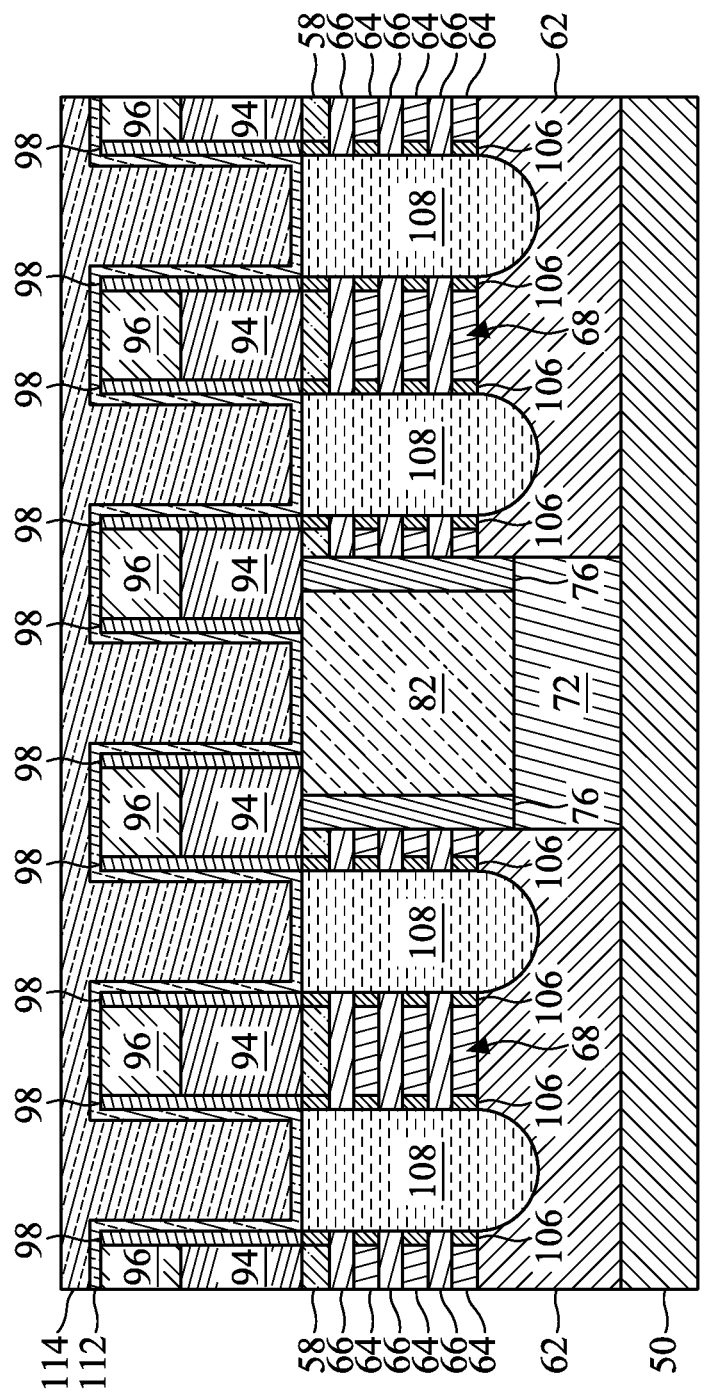
Figure 16C:
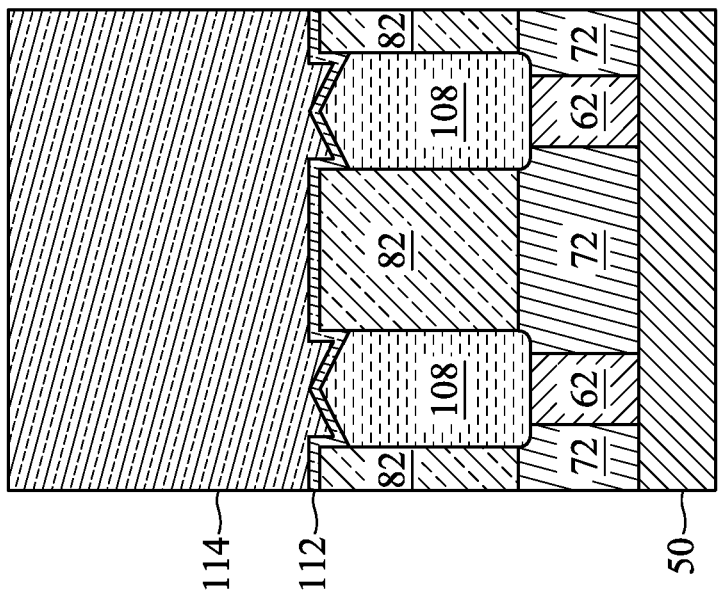
Figure 16B:
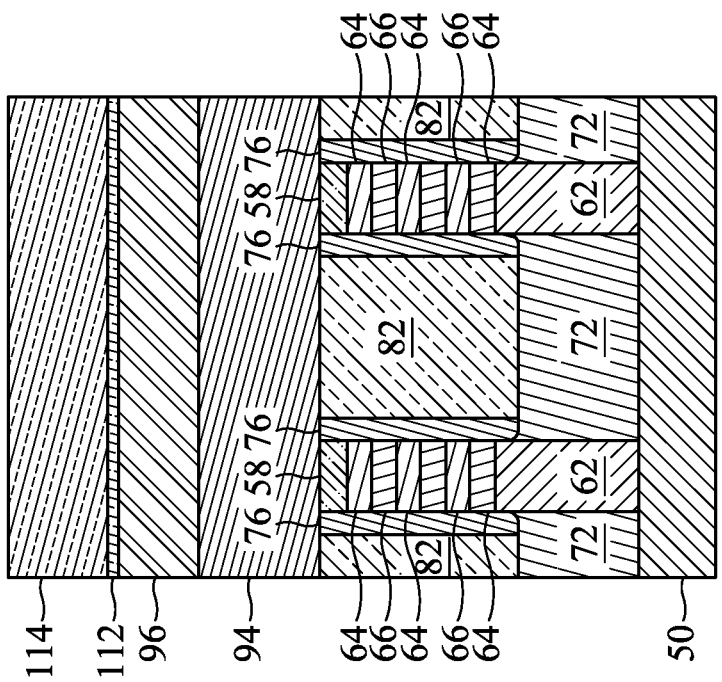

In FIGS. 16A-16C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by an any suitable method, such as CVD, ALD, or the like.

Figure 17A:
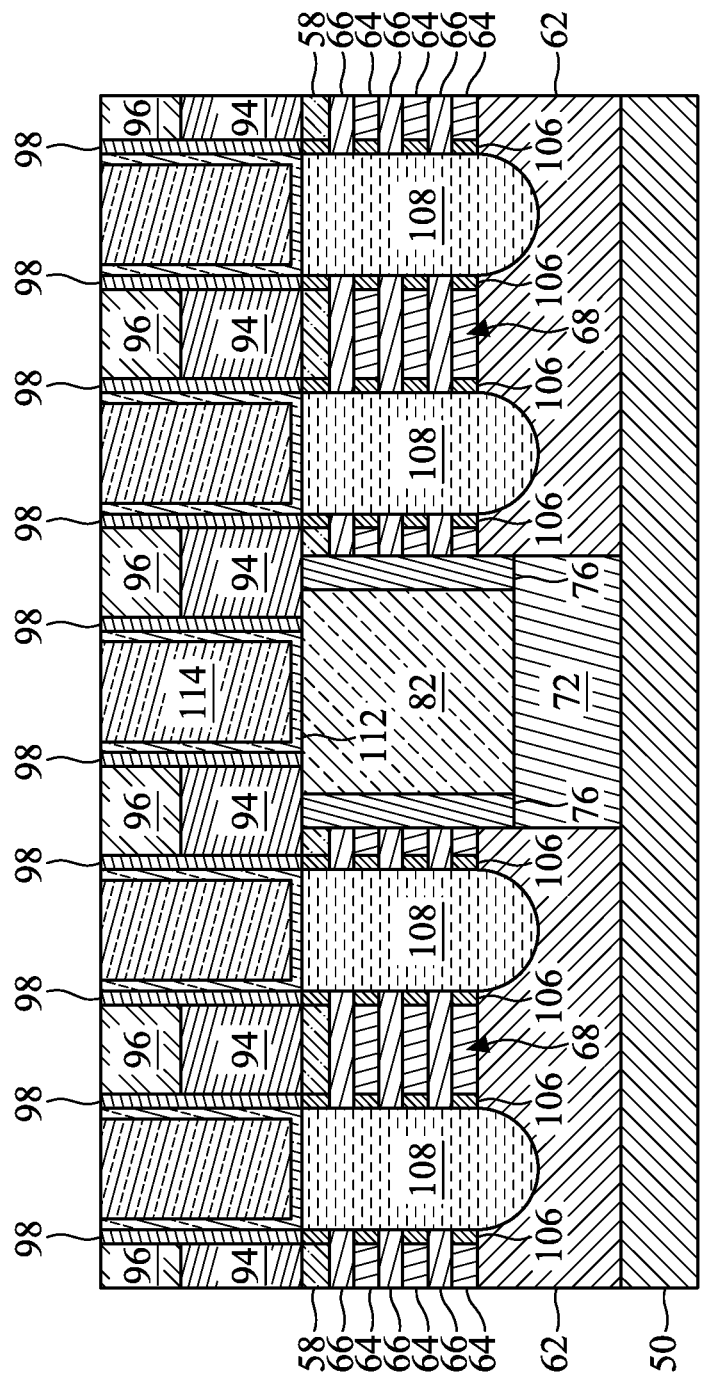
Figure 17C:
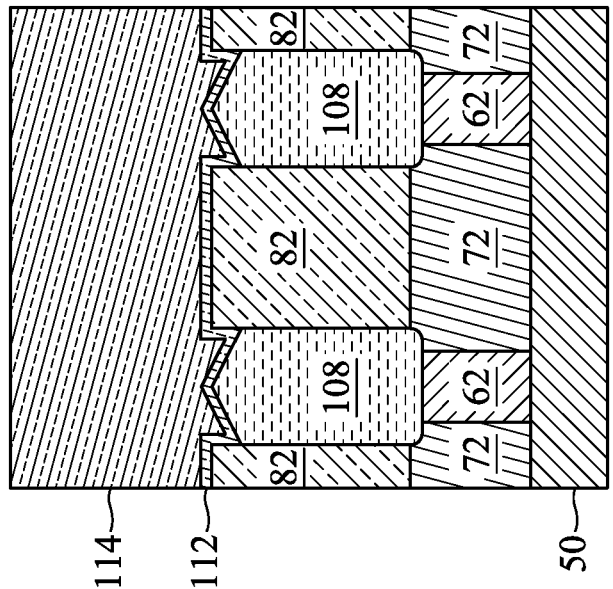
Figure 17B:
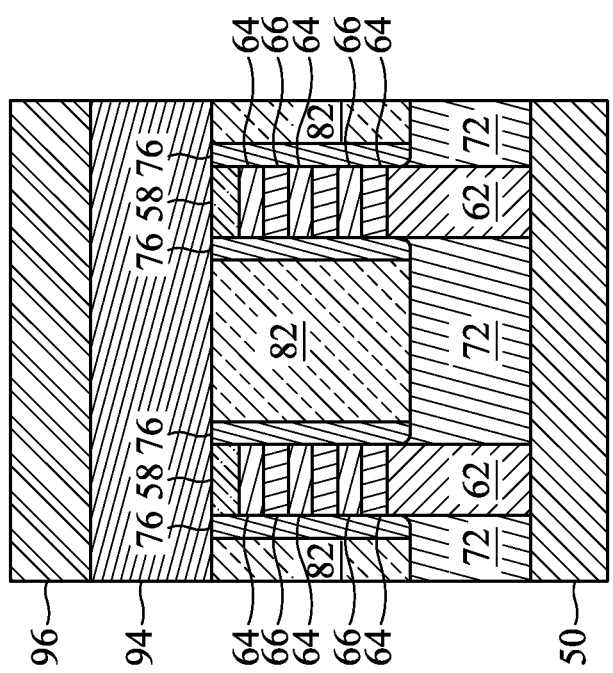

In FIGS. 17A-17C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 18A:
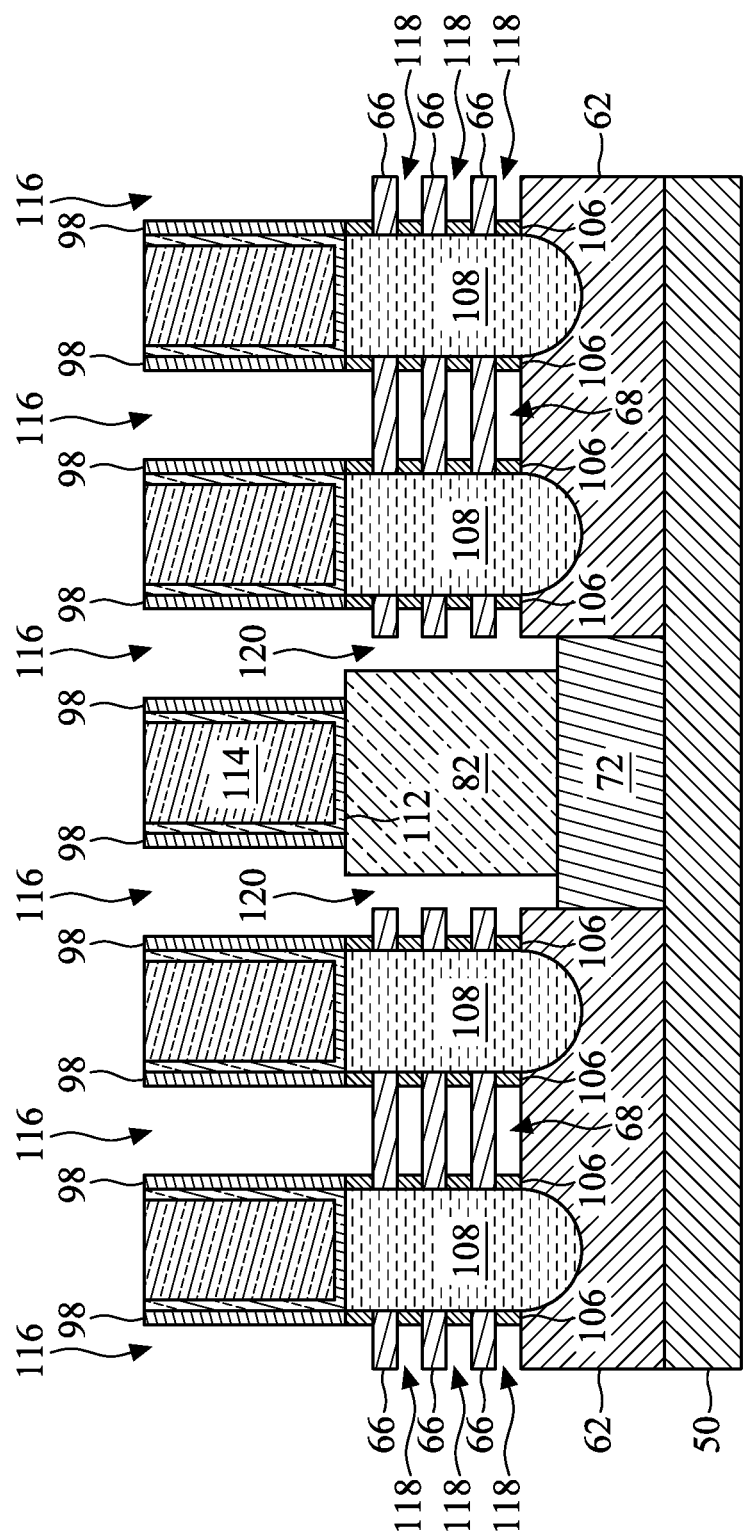
Figure 18C:
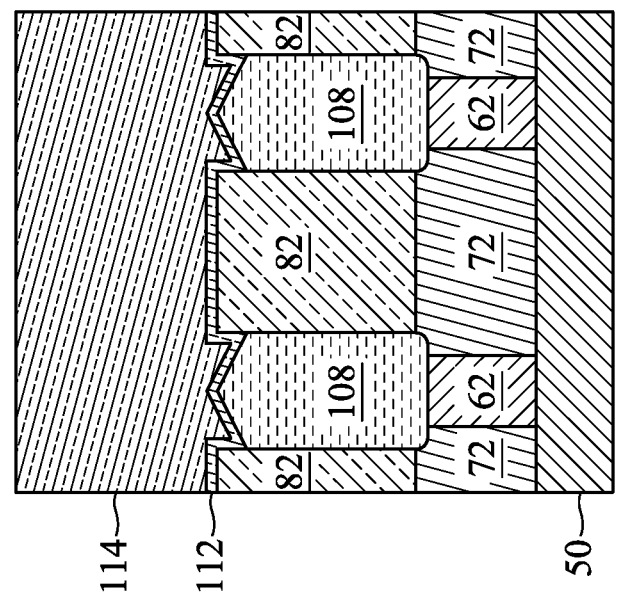
Figure 18B:
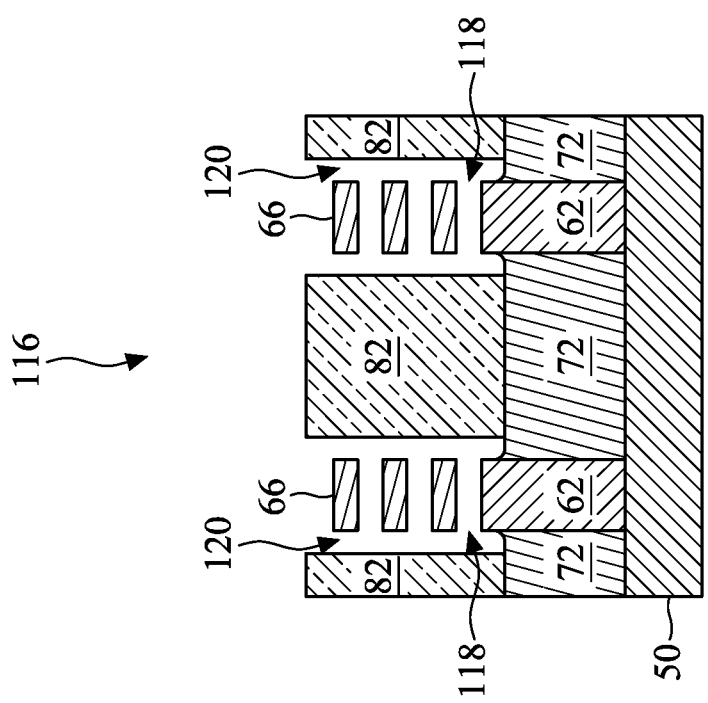

In FIGS. 18A-18C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings 118 are formed in regions between the nanostructures 66. The remaining portions of the dummy gates 76 are also removed to expand the recesses 116, such that openings 120 are formed in regions between semiconductor fins 62 and the hybrid fins 82. The remaining portions of the nanostructures 64 and the dummy gates 76 can be removed by any acceptable etching process that selectively etches the material(s) of the nanostructures 64 and the dummy gates 76 at a faster rate than the material of the nanostructures 66. The etching may be isotropic. For example, when the nanostructures 64 and the dummy gates 76 are formed of silicon germanium and the nanostructures 66 are formed of silicon, the etching process may be a wet etch using tetramethylammonium hydroxide (TMAH), ammonium hydroxide ($NH_4OH$), or the like. The masks 58 (if present) may also be removed. In some embodiments, a trim process (not separately illustrated) is performed to decrease the thicknesses of the exposed portions of the nanostructures 66.

Because the dummy gates 76 have a small footing profile, they may be more easily removed, without residue of the dummy gates 76 remaining on the top surface of the STI regions 72. More area may thus be available for replacement gates, and the formation of voids in the replacement gates may be avoided, thereby increasing device performance. Further, as noted above, the epitaxial source/drain regions 108 are formed so that no residue of the dummy gates 76 remains beneath them. Etching beneath the epitaxial source/drain regions 108 during the formation of the recesses 116 may thus be avoided, reducing the risk of damaging the epitaxial source/drain regions 108.

Figure 19A:
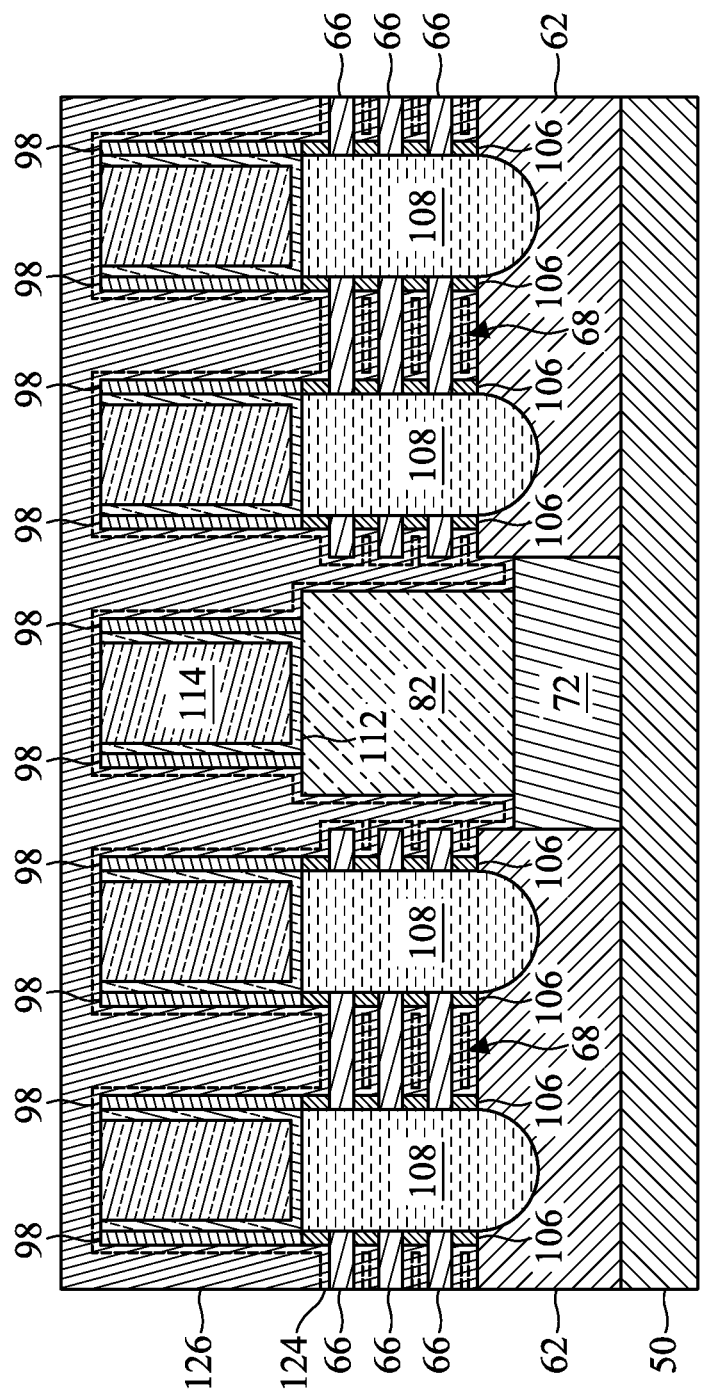
Figure 19C:
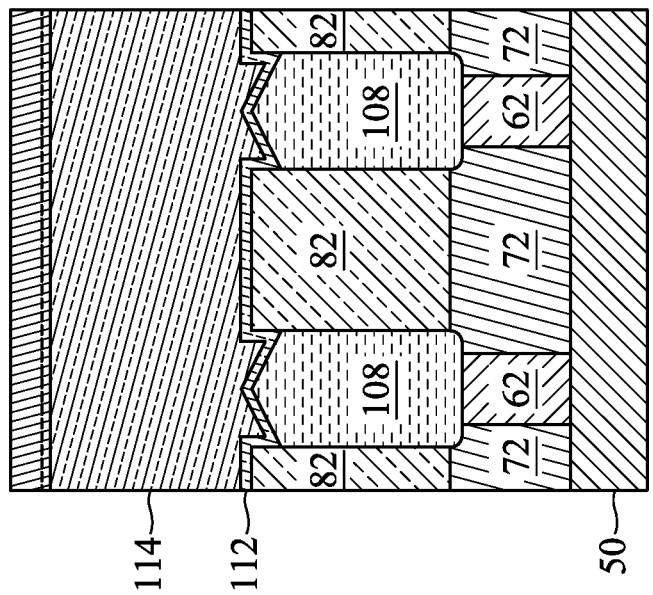
Figure 19B:
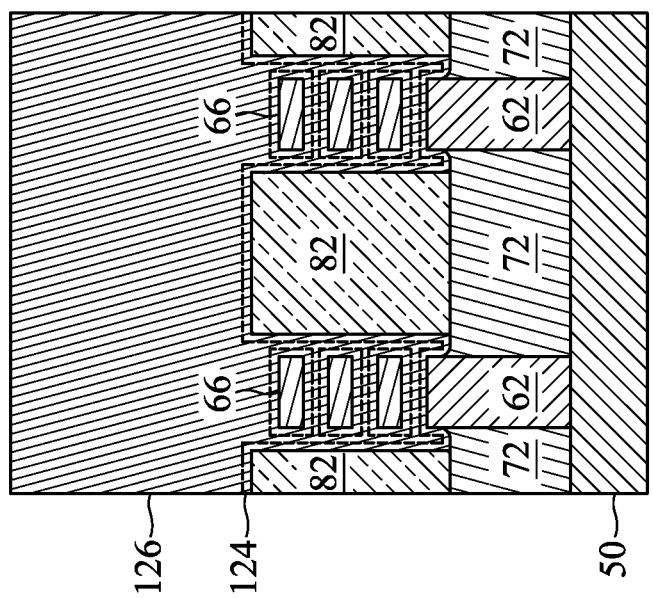

In FIGS. 19A-19C, a gate dielectric layer 124 is formed in the recesses 116. A gate electrode layer 126 is formed on the gate dielectric layer 124. The gate dielectric layer 124 and the gate electrode layer 126 are layers for replacement gates, and each wrap around all (e.g., four) sides of the nanostructures 66. Thus, the gate dielectric layer 124 and the gate electrode layer 126 are formed in the openings 118 and the openings 120 (see FIG. 18B).

The gate dielectric layer 124 is disposed on the sidewalls and/or the top surfaces of the semiconductor fins 62; on the top surfaces, the sidewalls, and the bottom surfaces of the nanostructures 66; on the sidewalls of the gate spacers 98 and the inner spacers 106; and on the top surfaces and the sidewalls of the hybrid fins 82. The gate dielectric layer 124 may also be formed on the top surfaces of the first ILD 114 and the gate spacers 98. The gate dielectric layer 124 may include an oxide such as silicon oxide or a metal oxide, a silicate such as a metal silicate, combinations thereof, multilayers thereof, or the like. The gate dielectric layer 124 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 124 is illustrated in FIGS. 19A-19C, the gate dielectric layer 124 may include any number of interfacial layers and any number of main layers.

The gate electrode layer 126 may include a metal-containing material such as titanium nitride, titanium oxide, tungsten, cobalt, ruthenium, aluminum, combinations thereof, multi-layers thereof, or the like. Although a single-layered gate electrode layer 126 is illustrated in FIGS. 19A-19C, the gate electrode layer 126 may include any number of work function tuning layers, any number of barrier layers, any number of glue layers, and a fill material.

The formation of the gate dielectric layers 124 in the n-type region 50N and the p-type region 50P may occur simultaneously such that the gate dielectric layers 124 in each region are formed of the same materials, and the formation of the gate electrode layers 126 may occur simultaneously such that the gate electrode layers 126 in each region are formed of the same materials. In some embodiments, the gate dielectric layers 124 in each region may be formed by distinct processes, such that the gate dielectric layers 124 may be different materials and/or have a different number of layers, and/or the gate electrode layers 126 in each region may be formed by distinct processes, such that the gate electrode layers 126 may be different materials and/or have a different number of layers. Various masking steps may be used to mask and expose appropriate regions when using distinct processes.

Figure 20A:
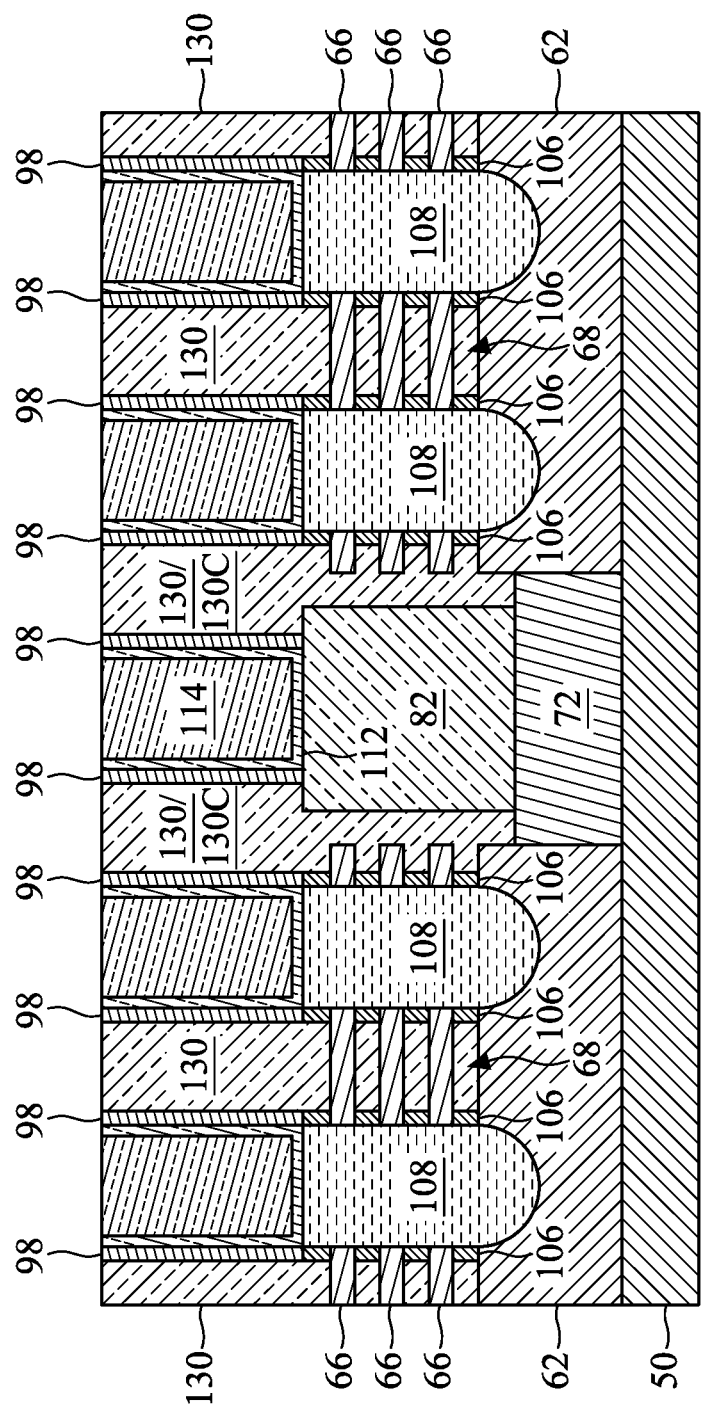
Figure 20C:
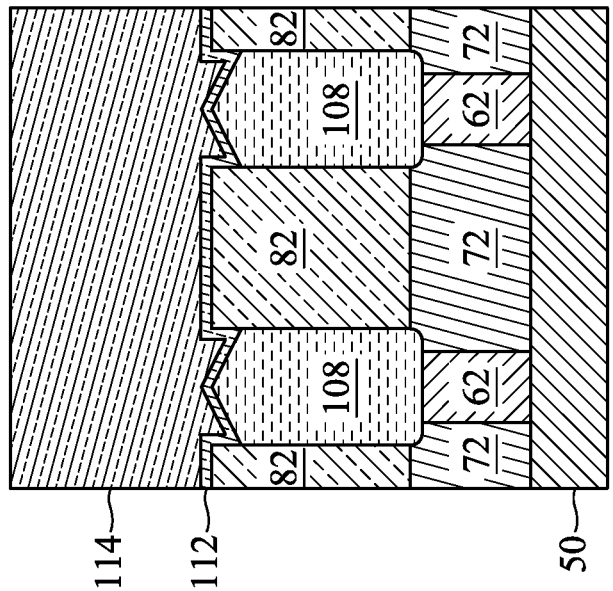
Figure 20B:
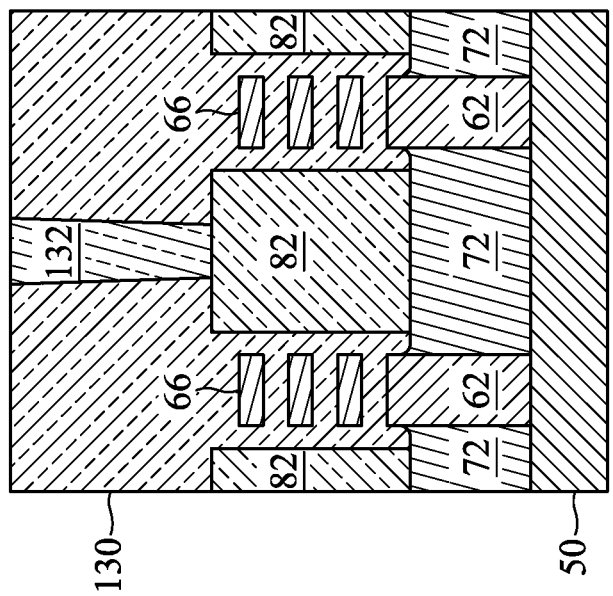

In FIGS. 20A-20C, a removal process is performed to remove the excess portions of the materials of the gate dielectric layer 124 and the gate electrode layer 126, which excess portions are over the top surfaces of the first ILD 114 and the gate spacers 98, thereby forming gate structures 130. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures 130). The gate electrode layer 126, when planarized, has portions left in the recesses 116 (thus forming gate electrodes for the gate structures 130). The top surfaces of the gate spacers 98; the CESL 112; the first ILD 114; and the gate structures 130 are coplanar (within process variations). The gate structures 130 are replacement gates of the resulting nanostructure transistors/FETs, and may be referred to as "metal gates." The gate structures 130 each extend along top surfaces, sidewalls, and bottom surfaces of a channel region 68 of the nano structures 66.

Some of the gate structures 130 are capping gate structures 130C. The capping gate structures 130C are non-function structures disposed on the ends of the semiconductor fins 62 and over the STI regions 72 between the semiconductor fins 62. The capping gate structures 130C are disposed between the hybrid fins 82 and the semiconductor fins 62 in the cross-section of FIG. 20A.

The gate structures 130 fill the area previously occupied by the nanostructures 64, the dummy gates 76, and the dummy gates 94. After they are formed, the gate structures 130 have the same profile shape as the dummy gates 76. The profile shapes of the gate structures 130 will be subsequently described in greater detail.

In some embodiments, isolation regions 132 are formed extending through some of the gate structures 130. An isolation region 132 is formed to divide (or "cut") a gate structure 130 into multiple gate structures 130. The isolation region 132 may be formed of a dielectric material, such as silicon nitride, silicon oxide, silicon oxynitride, or the like, which may be formed by a deposition process such as CVD, ALD, or the like. As an example to form the isolation regions 132, openings can be patterned in the desired gate structures 130. Any acceptable etch process, such as a dry etch, a wet etch, the like, or a combination thereof, may be performed to pattern the openings. The etching may be anisotropic. One or more layers of dielectric material may be deposited in the openings. A removal process may be performed to remove the excess portions of the dielectric material, which excess portions are over the top surfaces of the gate structures 130, thereby forming the isolation regions 132.

Figure 21A:
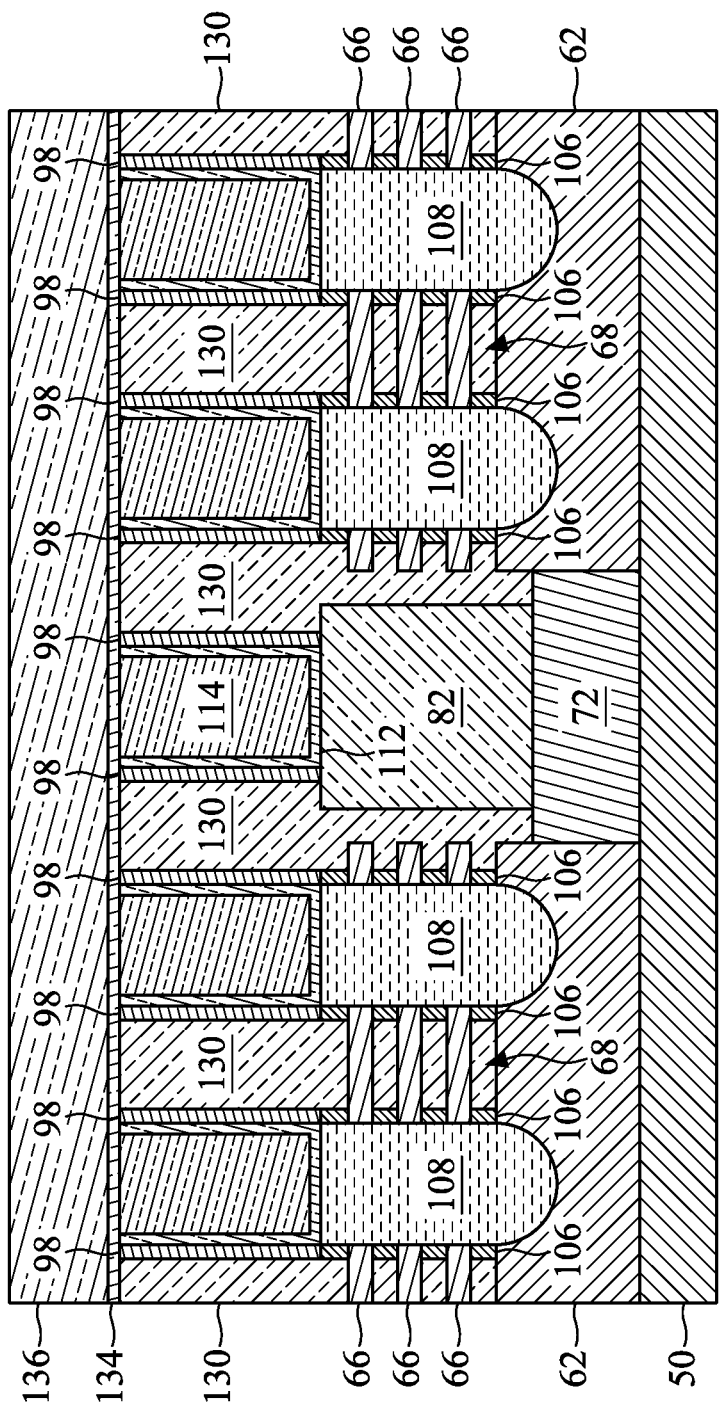
Figure 21C:
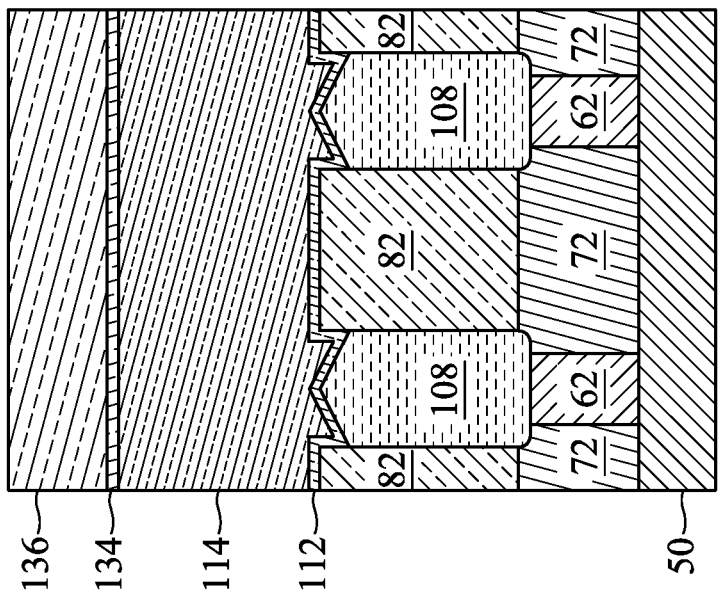
Figure 21B:
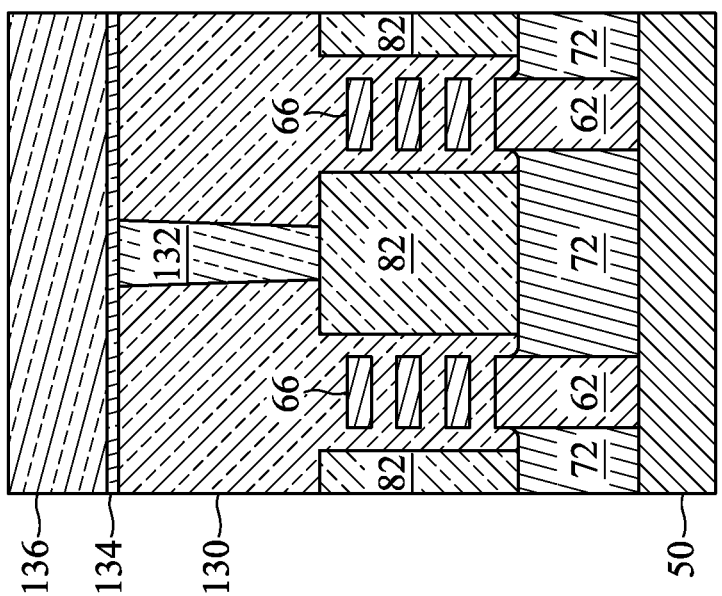

In FIGS. 21A-21C, a second ILD 136 is deposited over the gate spacers 98, the CESL 112, the first ILD 114, and the gate structures 130. In some embodiments, the second ILD 136 is a flowable film formed by a flowable CVD method. In some embodiments, the second ILD 136 is formed of a dielectric material such as PSG, BSG, BPSG, USG, or the like, which may be deposited by any suitable method, such as CVD, PECVD, or the like.

In some embodiments, an etch stop layer (ESL) 134 is formed between the second ILD 136 and the gate spacers 98, the CESL 112, the first ILD 114, and the gate structures 130. The ESL 134 may include a dielectric material, such as silicon nitride, silicon oxide, silicon oxynitride, or the like, having a high etching selectivity from the etching of the second ILD 136.

Figure 22A:
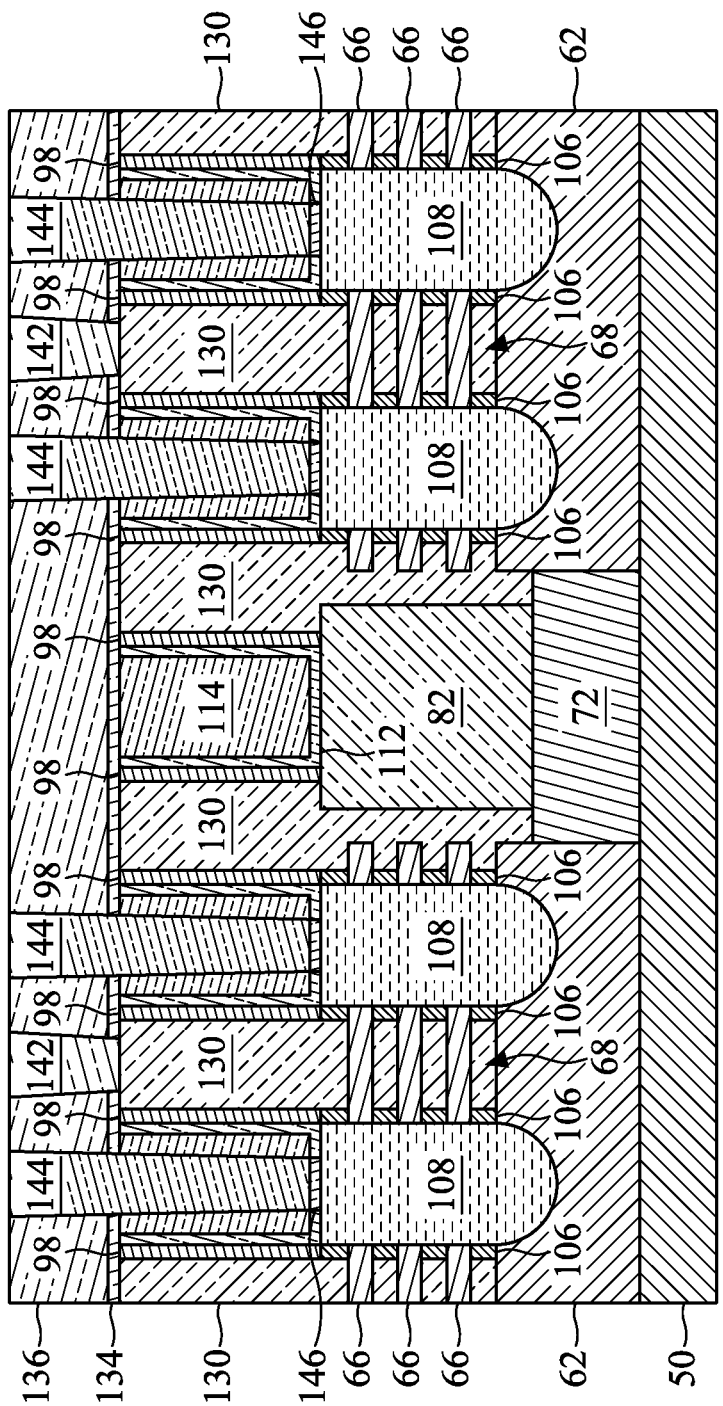
Figure 22C:
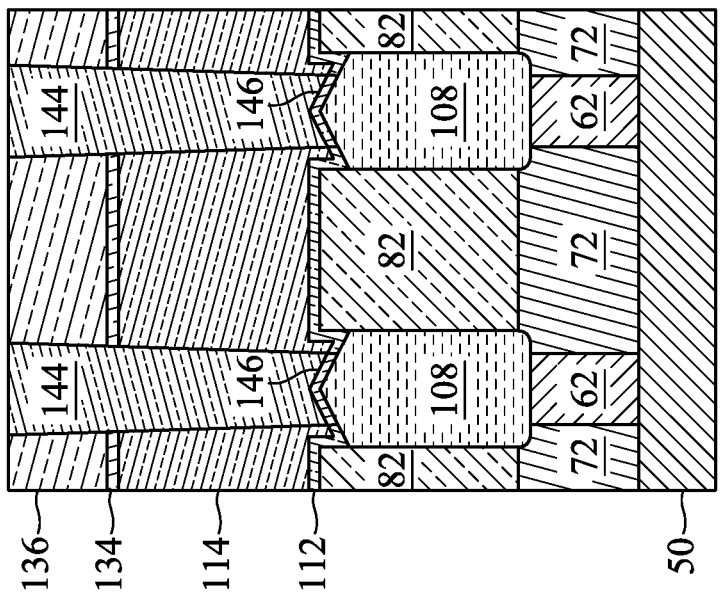
Figure 22B:
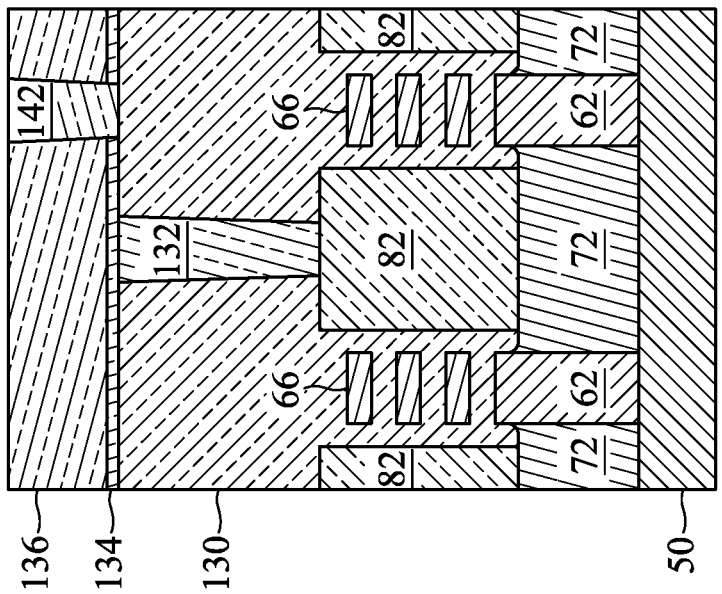

In FIGS. 22A-22C, gate contacts 142 and source/drain contacts 144 are formed to contact, respectively, the gate structures 130 and the epitaxial source/drain regions 108. The gate contacts 142 are physically and electrically coupled to the gate structures 130. The source/drain contacts 144 are physically and electrically coupled to the epitaxial source/drain regions 108.

As an example to form the gate contacts 142 and the source/drain contacts 144, openings for the gate contacts 142 are formed through the second ILD 136 and the ESL 134, and openings for the source/drain contacts 144 are formed through the second ILD 136, the ESL 134, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 136. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Figure 23A:
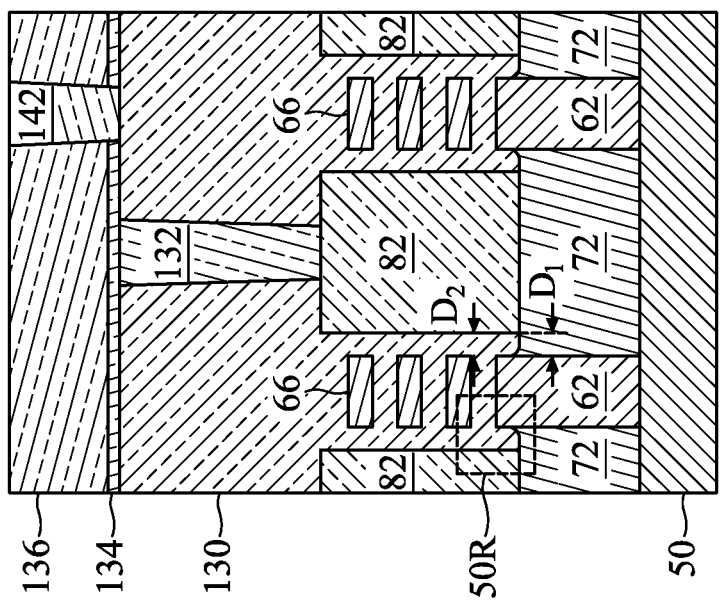
FIGS. 23A-23C are views of nanostructure transistors/FETs, in accordance with various embodiments.
Figure 23B:
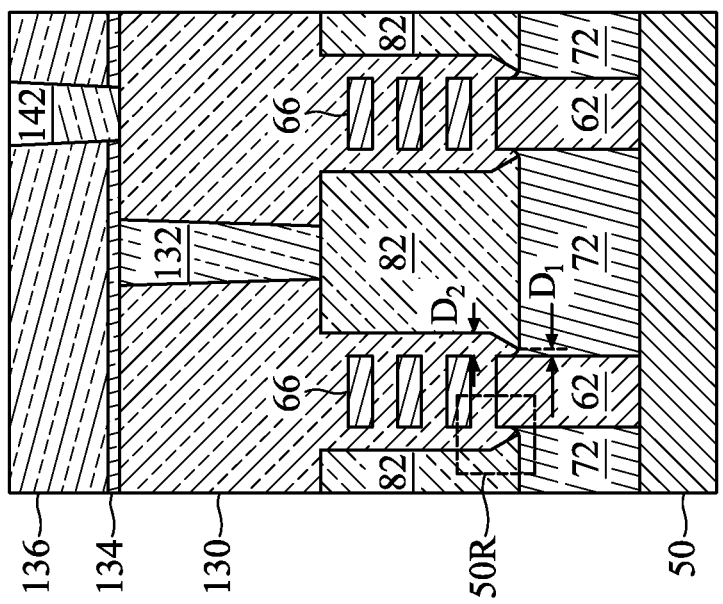
Figure 23C:
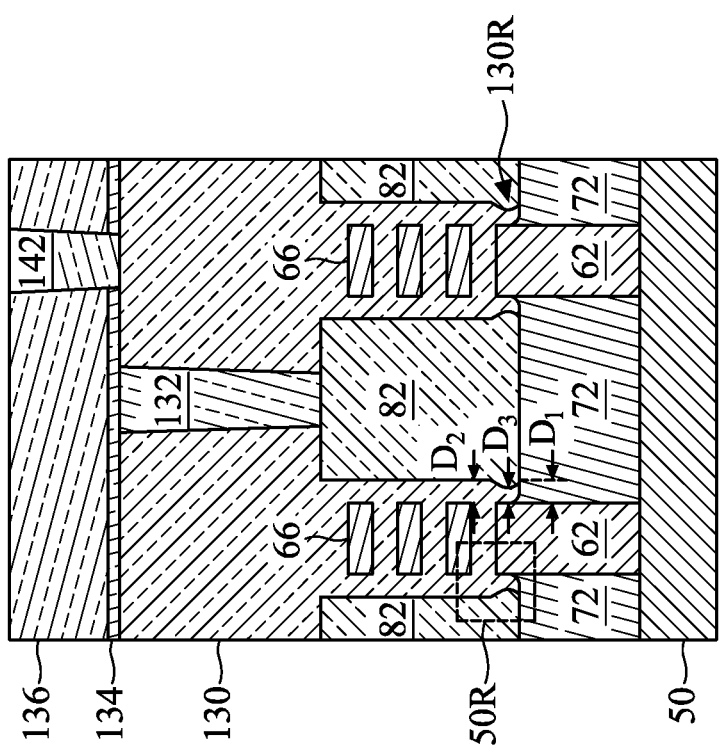

FIGS. 23A-23C are views of nanostructure transistors/FETs, in accordance with various embodiments. FIGS. 23A, 23B, and 23C show the resulting gate structures 130 after a replacement gate process is performed in the embodiments of FIGS. 9A, 9B, and 9C, respectively. As noted above, the gate structures 130 have the same profile shape as the dummy gates 76. Specifically, the portions of the gate structures 130 on the top surfaces of the STI regions 72 do not flare outward along the concave surfaces of the STI regions 72.

In the embodiment of FIG. 23A, after the replacement gate process, the bottom surfaces of the gate structures 130 extend away from the nanostructures 66 a first distance $D_1$, and the outer sidewalls of the gate structures 130 are disposed a second distance $D_2$ from the nanostructures 66, with the first distance $D_1$ being equal to the second distance $D_2$. Further, the hybrid fins 82 are disposed the first distance $D_1$ from the semiconductor fins 62 and are disposed the second distance $D_2$ from the nanostructures 66. In this embodiment, the sidewalls of the lower portions of the gate structures 130 are spaced apart a constant width. The distance $D_1$ and the distance $D_2$ can each be in the range of 0.5 nm to 30 nm.

In the embodiment of FIG. 23B, after the replacement gate process, the bottom surfaces of the gate structures 130 extend away from the nanostructures 66 a first distance $D_1$, and the outer sidewalls of the gate structures 130 are disposed a second distance $D_2$ from the nanostructures 66, with the first distance $D_1$ being less than the second distance $D_2$. Further, the hybrid fins 82 are disposed the first distance $D_1$ from the semiconductor fins 62 and are disposed the second distance $D_2$ from the nanostructures 66. In this embodiment, the sidewalls of the lower portions of the gate structures 130 are spaced apart by a distance that decreases linearly in a direction extending from the top of the gate structures 130 to the bottom of the gate structures 130. The distance $D_1$ and the distance $D_2$ can each be in the range of 0.5 nm to 30 nm.

In the embodiment of FIG. 23C, after the replacement gate process, the bottom surfaces of the gate structures 130 extend away from the nanostructures 66 a first distance $D_1$, and the outer sidewalls of the gate structures 130 are disposed a second distance $D_2$ from the nanostructures 66, with the first distance $D_1$ being less than the second distance $D_2$. Further, the hybrid fins 82 are disposed the first distance $D_1$ from the semiconductor fins 62 and are disposed the second distance $D_2$ from the nanostructures 66. In this embodiment, the sidewalls of the lower portions of the gate structures 130 are spaced apart by a distance that decreases non-linearly in a direction extending from the top of the gate structures 130 to the bottom of the gate structures 130, and then also increases non-linearly in that direction. The sidewalls of those portions of the gate structures 130 include sidewall recesses 130R. The hybrid fins 82 extend into the sidewall recesses 130R of the gate structures 130. The bottoms of the sidewall recesses 130R are disposed a third distance $D_3$ from the nanostructures 66, with the third distance $D_3$ being less than the second distance $D_2$ and the first distance $D_1$. The distance $D_1$, the distance $D_2$, and the distance $D_3$ can each be in the range of 0.5 nm to 30 nm.

Figure 24A:
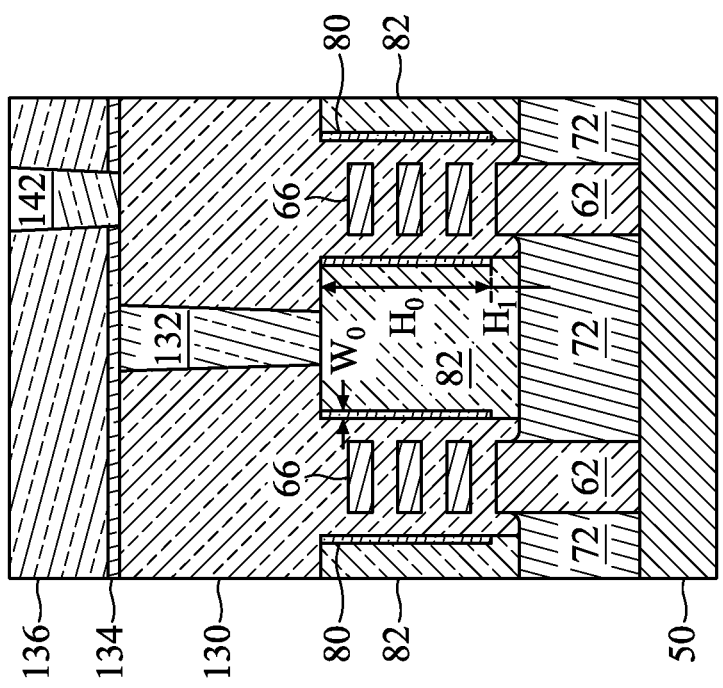
FIGS. 24A-24C are views of nanostructure transistors/FETs, in accordance with various embodiments.
Figure 24B:
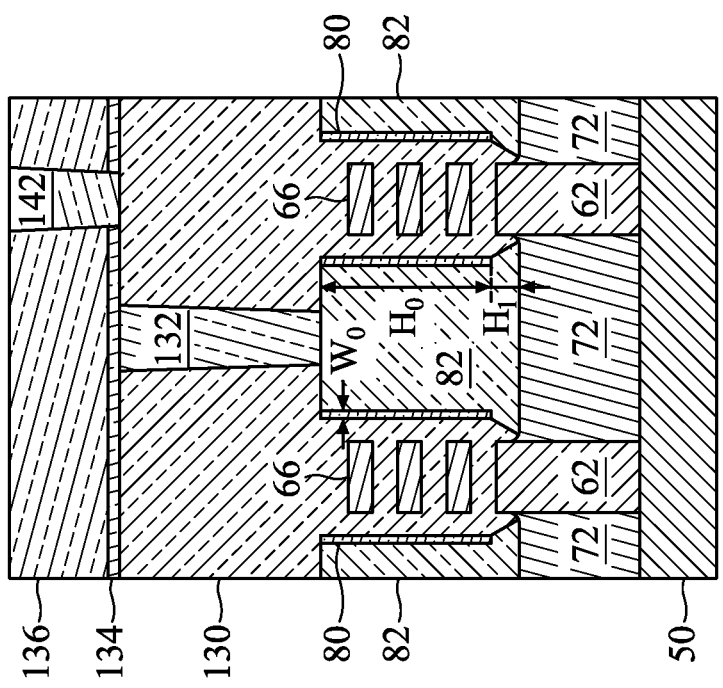
Figure 24C:
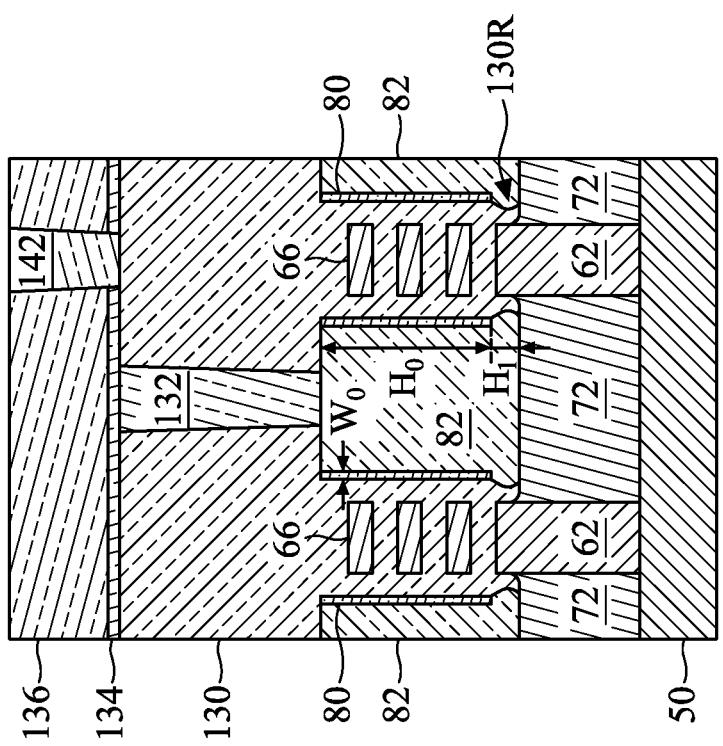

FIGS. 24A-24C are views of nanostructure transistors/FETs, in accordance with various embodiments. These embodiments are similar to the embodiments of FIGS. 23A-23C, respectively, except the protective layers 80 are not removed, and remain in the final devices. The protective layers 80 extend along the portions of the sidewall of the gate structures 130 that are adjacent the nanostructures 66. In these embodiments, the protective layers 80 have a constant width. The protective layers 80 are in contact with the upper portions of the sidewalls of the gate structures 130. The protective layers 80 can have a height $H_0$ in the range of 1 nm to 300 nm and a width $W_0$ in the range of 0.3 nm to 15 nm. The lower portions of the sidewalls of the gate structures 130 that are not covered by the protective layers 80 can have a height $H_1$ in the range of 0 nm to 300 nm.

Figure 25A:
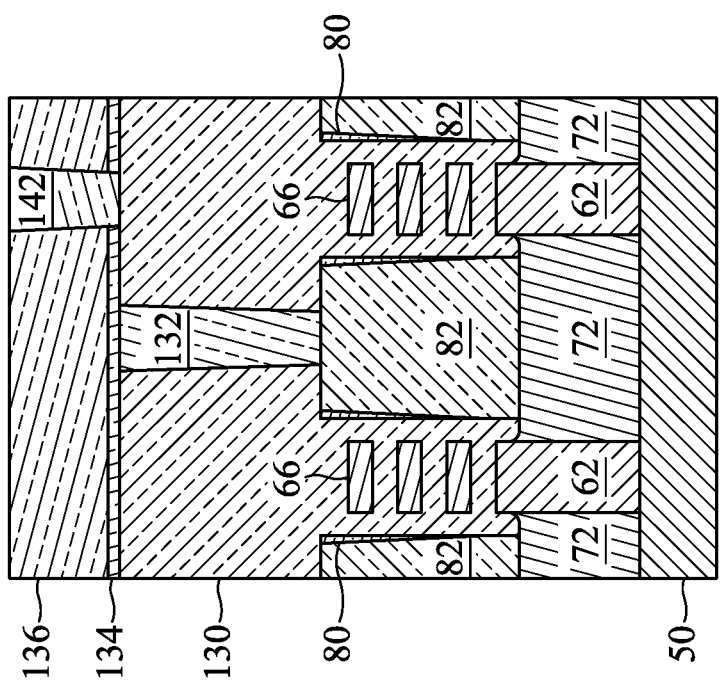
FIGS. 25A-25C are views of nanostructure transistors/FETs, in accordance with various embodiments.
Figure 25B:
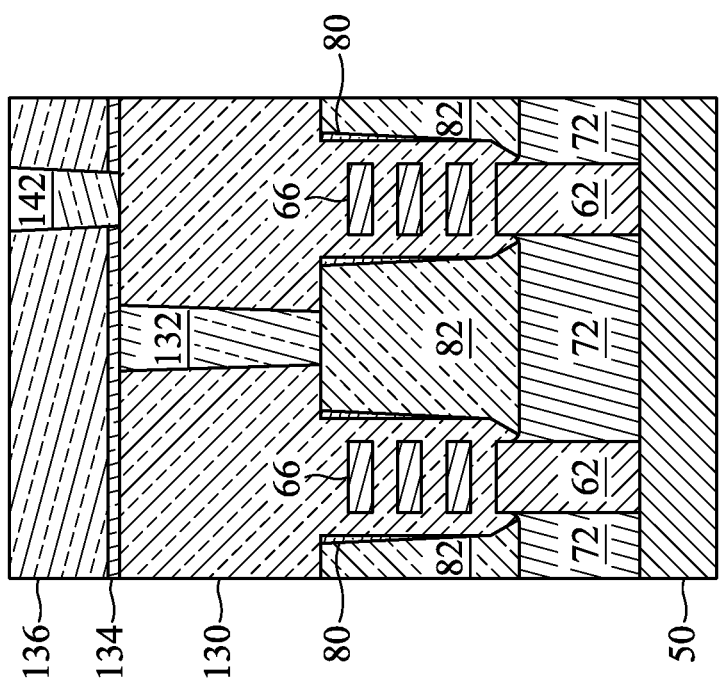
Figure 25C:
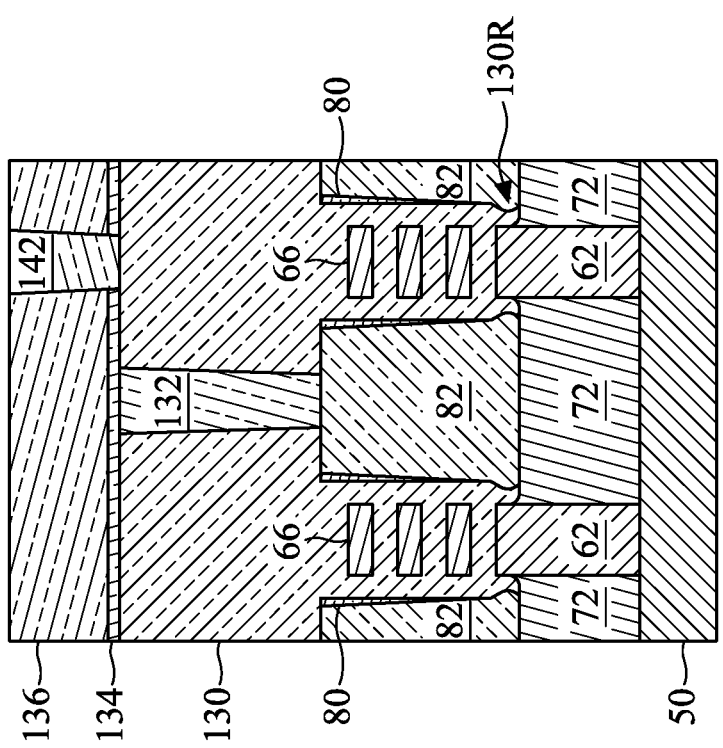

FIGS. 25A-25C are views of nanostructure transistors/FETs, in accordance with various embodiments. These embodiments are similar to the embodiments of FIGS. 24A-24C, respectively, except the protective layers 80 have a width that decreases in a direction extending from the top of the protective layers 80 to the bottom of the protective layers 80.

Figure 26A:
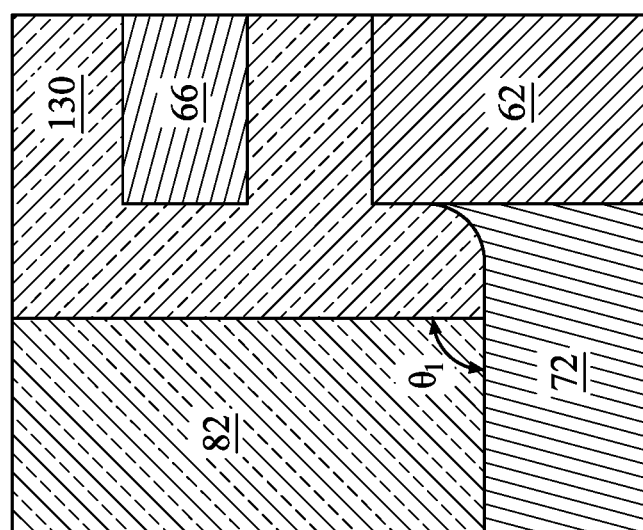
FIGS. 26A-26C are detailed views of nanostructure transistors/FETs, respectively.
Figure 26B:
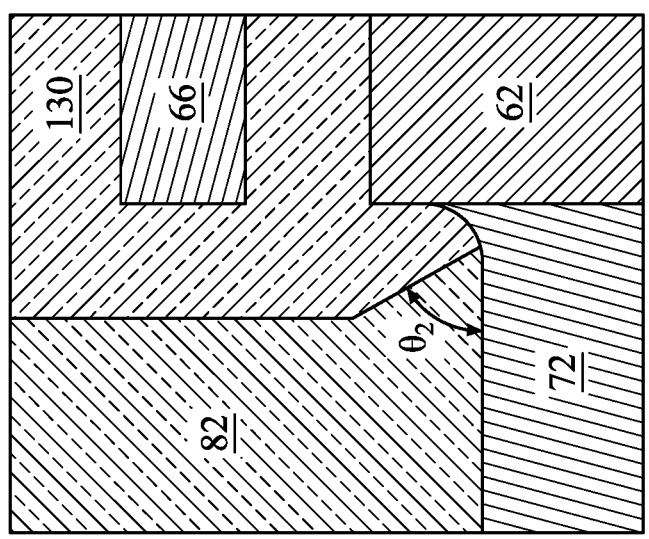
Figure 26C:
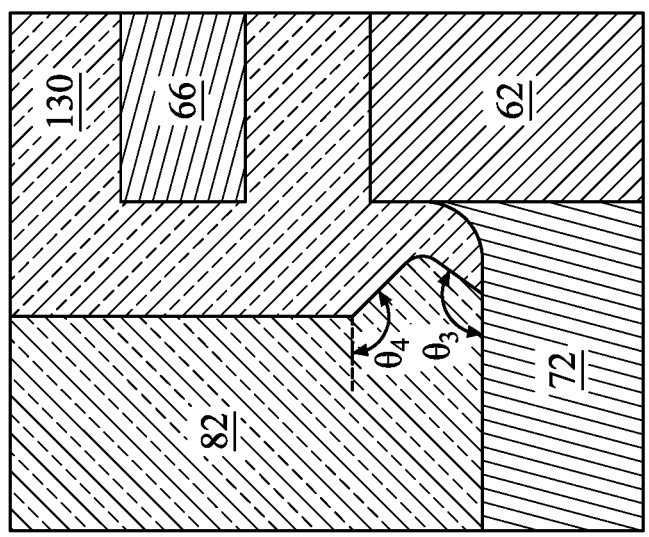

FIGS. 26A-26C are detailed views of regions 50R in FIGS. 23A-23C, respectively. Referring to FIG. 26A, the sidewalls of the lower portions of the gate structures 130 are substantially perpendicular with a plane parallel to the major surface of the substrate 50. For example, the angle $\theta_1$ between the sidewalls of the gate structures 130 and the top surfaces of the STI regions 72 can be in the range of 80 degrees to 100 degrees. Referring to FIG. 26B, the sidewalls of the lower portions of the gate structures 130 are form an acute angle with a plane parallel to the major surface of the substrate 50. For example, the angle $\theta_2$ between the sidewalls of the gate structures 130 and the top surfaces of the STI regions 72 can be in the range of 30 degrees to 85 degrees. Referring to FIG. 26C, the surfaces of the gate structures 130 defining the sidewall recesses 130R form several angles. Specifically, the surfaces of the gate structures 130 defining the sidewall recesses 130R form an angle $\theta_3$ with the top surfaces of the STI regions 72 and an angle $\theta_4$ with a plane parallel to the major surface of the substrate 50. The angle $\theta_3$ and the angle $\theta_4$ can each be in the range of 95 degrees to 150 degrees.

FIGS. 27A-27D are views of intermediate stages in the patterning of dummy gates 76 with a small footing profile, in accordance with some other embodiments. The dummy gates 76 are formed with a small footing profile by patterning the dummy gate layer 74 with multiple etching processes, in a similar manner as described for FIGS. 7A-9C. In this embodiment, a different type of protective layers 80 is used. Specifically, the protective layers 80 are passivation layers 80P. The passivation layers 80P may be formed by a separate process before or after the dummy gate layer 74 is initially patterned. Advantageously, the passivation layers 80P may be formed to a more uniform thickness than the byproduct layers 80B. Further, the passivation gas may be omitted from the first etching process for initially patterning the dummy gates 76.

The passivation layers 80P may be formed by a surface modification process or a deposition process. Generally, surface modification processes are easier to control to reduce damage to the dummy gates 76, and deposition processes are easier to control the thickness of the resulting passivation layers 80P. The surface modification process may be a plasma modification process, a chemical modification process, or the like. In some embodiments, the thickness of the passivation layers 80P is in the range of 2 Å to 150 Å.

In embodiments where a plasma modification process is used, forming the passivation layers 80P may include exposing the structure to a passivation gas while generating a plasma. The passivation gas may be $CH_4$, $SiCl_4$, $N_2$, $O_2$, $CO_2$, $SO_2$, CO, or like. In some embodiments, a dilute gas such as Ar, He, Ne, or combinations thereof may be utilized. In some embodiments, the process conditions of the plasma modification process include: a pressure in the range of 1 mTorr to 10 Torr; a plasma source power (configured to control the ratio of ions to radicals) in the range of 10 W to 3000 W; a plasma bias power (configured to control the plasma direction) in the range of 0 W to 3000 W; and a gas source flow rate in the range of 1 sccm to 5000 sccm. The composition of the passivation layers 80P formed by the plasma modification process depends on the passivation gas used. Continuing the example where the dummy gate layer 74 is formed of silicon or silicon germanium: the passivation layers 80P may be formed of SiO or SiGeO when using an oxygen-based passivation gas (e.g., $O_2$, $CO_2$, $SO_2$, CO, or the like); the passivation layers 80P may be formed of SiN or SiGeN formed when using a nitrogen-based passivation gas (e.g., $N_2$ or the like); and the passivation layers 80P may be formed of SiS or SiGeS formed when using a sulfur-based passivation gas (e.g., $SO_2$ or the like). In some embodiments, a plurality of passivation gases may be utilized in the plasma modification process. For example, a mixture of an oxygen-based passivation gas, a nitrogen-based passivation gas, and a sulfur-based passivation gas (e.g., $SO_2$ and $N_2$) may be utilized in the plasma modification process, and the passivation layers 80P may be formed of $SiGeS_xO_yN_z$.

In embodiments where a chemical modification process is used, forming the passivation layers 80P may include exposing the structure to a passivation solution without generating a plasma. The passivation solution may include a main passivation chemical and an assistant passivation chemical in a solvent. The main passivation chemical may be $O_3$, $CO_2$, or the like. The assistant passivation chemical may be $H_2SO_4$, $NH_3$, or the like. The solvent may be deionized (DI) water, alcohol, acetone, or the like.

In embodiments where a deposition process is used, forming the passivation layers 80P may include PECVD, CVD, ALD, PVD, or a growth process suitable for depositing a dielectric material. The passivation layers 80P may be formed of a dielectric material such as SiN, SiON, SiCON, SiC, SiOC, $SiO_2$, or the like.

Figure 27A:
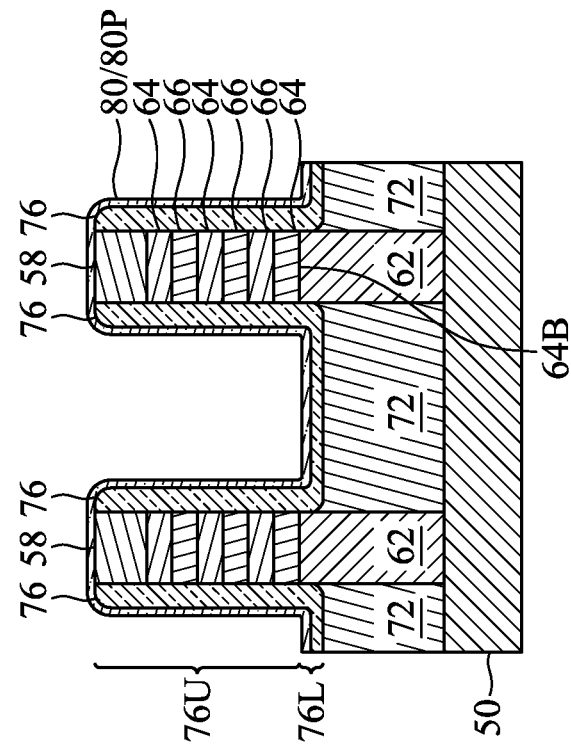
FIGS. 27A-27D are views of intermediate stages in the manufacturing of nanostructure transistors/FETs, in accordance with some embodiments.

In some embodiments, the passivation layers 80P are formed on the dummy gate layer 74 before the dummy gate layer 74 is patterned, as illustrated by FIG. 27A. After the passivation layers 80P are formed, the dummy gate layer 74 and the passivation layers 80P may be simultaneously patterned to form dummy gates 76 with a small footing profile. For example, an etching process can be performed to etch both the dummy gate layer 74 and the passivation layers 80P. The etching process can be controlled (e.g., by adjusting the plasma bias power) so that it etches in a lateral direction that is substantially parallel to the major surface of the substrate 50. Portions of the passivation layers 80P may be removed by the etching process to expose the lower portions of the dummy gate layer 74, and the lateral direction of the etching process results in etching of the dummy gate layer 74 to form dummy gates 76 with a small footing profile. In some embodiments, portions of the dummy gates 76 can extend over the mask 58 (if present) and the nanostructures 64, 66. Those portions of the dummy gates 76 may be removed in a subsequent process, such as the removal process that is performed to remove the portions of the hybrid fin layer 78 over the mask 58 (if present) and the nanostructures 64, 66 (see FIGS. 11A-11C).

Figure 27B:
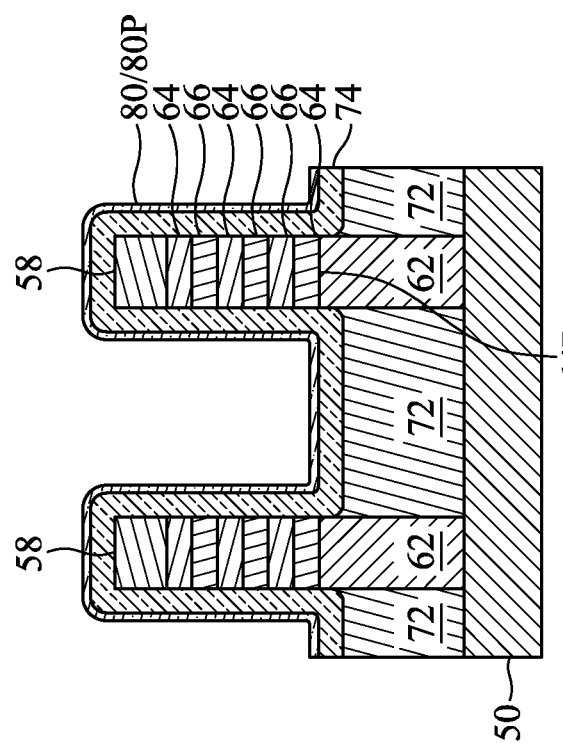

In some embodiments, the passivation layers 80P are formed after the dummy gate layer 74 is initially patterned but before the dummy gates 76 are trimmed, so that the STI regions 72 are covered, as illustrated by FIG. 27B. After the passivation layers 80P are formed, the dummy gates 76 may be trimmed while they are covered by the passivation layers 80P to form dummy gates 76 with a small footing profile, thereby obtaining the structure of FIG. 8C. For example, an etching process can be performed to etch both the dummy gates 76 and the passivation layers 80P. The etching process can be controlled (e.g., by adjusting the plasma bias power) so that it etches in a lateral direction that is substantially parallel to the major surface of the substrate 50. Portions of the passivation layers 80P may be removed by the etching process (thus forming the structure of FIG. 7B), and the lateral direction of the etching process results in etching of the lower portions of the dummy gates 76 to form dummy gates 76 with a small footing profile (thus forming the structure of FIG. 8C).

Figure 27C:
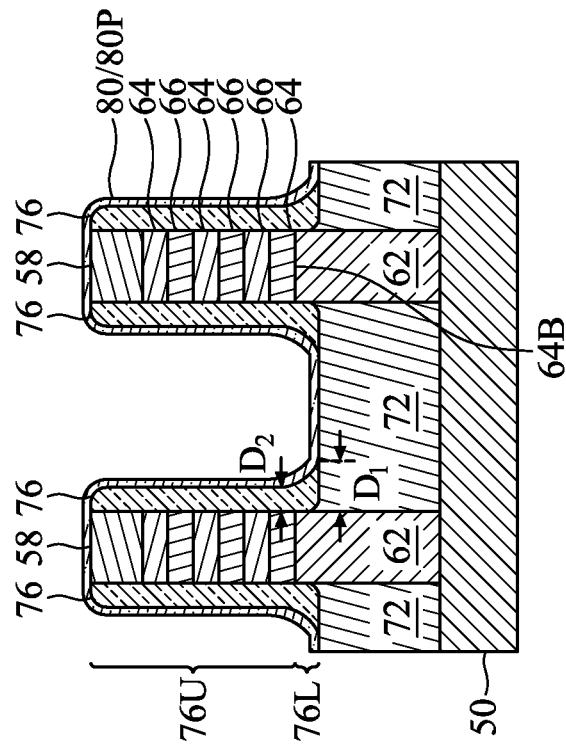
Figure 27D:
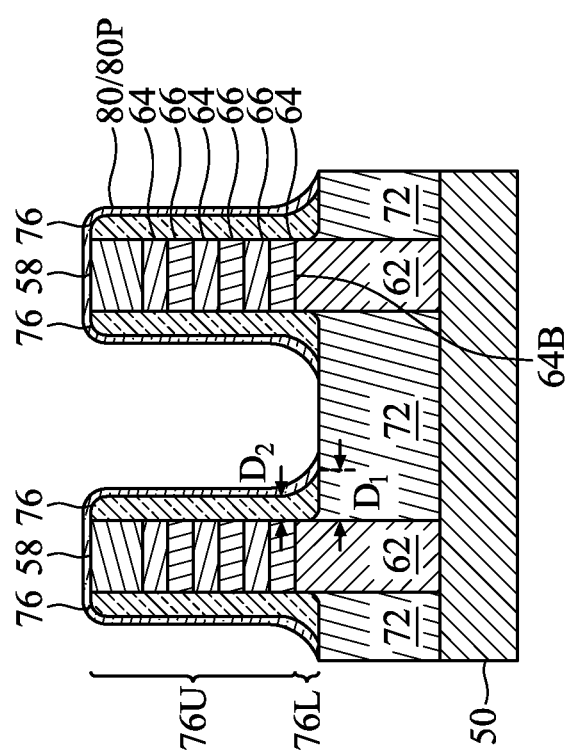

In some embodiments, the passivation layers 80P are formed after the dummy gate layer 74 is initially patterned but before the dummy gates 76 are trimmed, so that the STI regions 72 are exposed, as illustrated by FIGS. 27C and 27D. In some embodiments where the passivation layers 80P are formed by a surface modification process, the passivation layers 80P may be selectively formed on the mask 58 (if present) and the dummy gates 76 without being formed on the STI regions 72, as illustrated by FIG. 27C. In some embodiments where the passivation layers 80P are formed by a deposition process, the passivation layers 80P may be conformally formed on the mask 58 (if present), the dummy gates 76, and the STI regions 72, as illustrated by FIG. 27D. After the passivation layers 80P are formed, the dummy gates 76 may be trimmed while they are covered by the passivation layers 80P to form dummy gates 76 with a small footing profile, thereby obtaining the structure of FIG. 8A or 8B. For example, an etching process can be performed to etch both the dummy gates 76 and the passivation layers 80P. The etching process can be controlled (e.g., by adjusting the plasma bias power) so that it etches in a diagonal direction that forms an acute angle with a plane that is parallel to the major surface of the substrate 50. The diagonal direction of the etching process results in etching through the passivation layers 80P at the lower portions of the dummy gates 76 (thus forming the structure of FIG. 7A), and then etching of the lower portions of the dummy gates 76 to form dummy gates 76 with a small footing profile (thus forming the structures of FIG. 8A or 8B).

As noted above, a same substrate 50 may have sparse regions and dense regions. In such embodiments, the passivation layers 80P can have different thicknesses in different regions. As a result, dummy gates 76 with different footing profiles may be formed from the same initial structure. For example, the structure of FIG. 27A may be formed in a dense region and a sparse region. The passivation layers 80P may be formed over those structures, and then the dummy gates 76 patterned, with the structure of FIG. 8A or 8B resulting in the dense region and the structure of FIG. 8C resulting in the sparse region.

Embodiments may achieve advantages. Forming the dummy gates 76 with a small footing profile increases the processing window for subsequent operations, such as a replacement gate process and/or an epitaxial growth process for source/drain regions. Specifically, no residue of the dummy gates 76 may remain beneath the epitaxial source/drain regions 108, avoiding damage to the epitaxial source/drain regions 108 when the dummy gates 76 are removed in a replacement gate process. Further, dummy gates 76 with a small footing profile may be more easily removed in a replacement gate process, avoiding the formation of voids in the replacement gates may be avoided, thereby increasing device performance.

In an embodiment, a device includes: an isolation region; nanostructures protruding above a top surface of the isolation region; a gate structure wrapped around the nanostructures, the gate structure having a bottom surface contacting the isolation region, the bottom surface of the gate structure extending away from the nanostructures a first distance, the gate structure having a sidewall disposed a second distance from the nanostructures, the first distance less than or equal to the second distance; and a hybrid fin on the sidewall of the gate structure. In some embodiments of the device, the first distance is less than the second distance. In some embodiments of the device, the hybrid fin extends into a sidewall recess of the gate structure. In some embodiments of the device, the first distance is equal to the second distance. In some embodiments of the device, the first distance and the second distance are each in a range of 0.5 nm to 30 nm. In some embodiments, the device further includes: a protective layer disposed between the hybrid fin and the gate structure, the protective layer covering an upper portion of the sidewall of the gate structure, a lower portion of the sidewall of the gate structure uncovered by the protective layer.

In an embodiment, a device includes: an isolation region; a semiconductor fin protruding above a top surface of the isolation region; nanostructures over the semiconductor fin; a gate structure wrapped around the nanostructures; and a hybrid fin on a sidewall of the gate structure, the hybrid fin disposed a first distance from the semiconductor fin, the hybrid fin disposed a second distance from the nanostructures, the second distance greater than the first distance. In some embodiments, the device further includes: a protective layer between the hybrid fin and the gate structure, the protective layer extending along a portion of the sidewall of the gate structure adjacent the nanostructures. In some embodiments of the device, the protective layer includes $SiGeS_xO_yN_z$. In some embodiments of the device, the protective layer includes a dielectric material. In some embodiments of the device, a portion of the hybrid fin extends into a sidewall recess of the gate structure, the portion of the hybrid fin disposed a third distance from the semiconductor fin, the third distance less than the first distance and the second distance.

In an embodiment, a method includes: depositing a dummy gate layer over an isolation region and alternating first nanostructures and second nanostructures, the first nanostructures and the second nanostructures protruding above a top surface of the isolation region; patterning the dummy gate layer to form a dummy gate on sidewalls of the first nanostructures, sidewalls of the second nanostructures, and the top surface of the isolation region; forming a protective layer on an upper portion of the dummy gate; trimming a lower portion of the dummy gate while the protective layer covers the upper portion of the dummy gate; and replacing the dummy gate and the first nanostructures with a metal gate, the metal gate wrapped around the second nanostructures. In some embodiments of the method, the protective layer is a byproduct layer formed during the patterning the dummy gate layer, and the patterning the dummy gate layer includes etching the dummy gate layer with a gas source including a main etching gas and a passivation gas. In some embodiments of the method, the dummy gate layer and the first nanostructures include silicon or silicon germanium; and the passivation gas is a mixture of an oxygen-based passivation gas, a nitrogen-based passivation gas, and a sulfur-based passivation gas. In some embodiments of the method, the protective layer is a passivation layer formed after the patterning the dummy gate layer, and forming the protective layer includes exposing the dummy gate to a passivation gas while generating a plasma. In some embodiments of the method, the protective layer is a passivation layer formed after the patterning the dummy gate layer, and forming the protective layer includes exposing the dummy gate to a passivation solution without generating a plasma. In some embodiments of the method, the protective layer is a passivation layer formed after the patterning the dummy gate layer, and forming the protective layer includes depositing a dielectric material on the dummy gate. In some embodiments of the method, the dummy gate has a sidewall and has a bottom surface contacting the isolation region, the sidewall of the dummy gate is disposed a first distance from the second nanostructures, and trimming the lower portion of the dummy gate includes: etching the lower portion of the dummy gate until the bottom surface of the dummy gate extends away from the second nanostructures a second distance less than the first distance. In some embodiments of the method, the dummy gate has a sidewall and has a bottom surface contacting the isolation region, the sidewall of the dummy gate is disposed a first distance from the second nanostructures, and trimming the lower portion of the dummy gate includes: etching the lower portion of the dummy gate until the bottom surface of the dummy gate extends away from the second nanostructures a second distance equal to the first distance. In some embodiments of the method, etching the lower portion of the dummy gate forms a sidewall recess in the lower portion of the dummy gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a dummy gate layer over an isolation region and alternating first nanostructures and second nanostructures, the first nanostructures and the second nanostructures protruding above a top surface of the isolation region;
patterning the dummy gate layer to form a dummy gate on sidewalls of the first nanostructures, sidewalls of the second nanostructures, and the top surface of the isolation region;
forming a protective layer on an upper portion of the dummy gate;
trimming a lower portion of the dummy gate while the protective layer covers the upper portion of the dummy gate; and
replacing the dummy gate and the first nanostructures with a gate structure, the gate structure wrapped around the second nanostructures.

2. The method of claim 1, wherein the protective layer is a byproduct layer formed during the patterning of the dummy gate layer, and the patterning the dummy gate layer comprises etching the dummy gate layer with a gas source comprising a main etching gas and a passivation gas.

3. The method of claim 2, wherein the dummy gate layer and the first nanostructures comprise silicon or silicon germanium; and the passivation gas is a mixture of an oxygen-based passivation gas, a nitrogen-based passivation gas, and a sulfur-based passivation gas.

4. The method of claim 1, wherein the protective layer is a passivation layer formed after the patterning of the dummy gate layer, and forming the protective layer comprises exposing the dummy gate to a passivation gas while generating a plasma.

5. The method of claim 1, wherein the protective layer is a passivation layer formed after the patterning of the dummy gate layer, and forming the protective layer comprises exposing the dummy gate to a passivation solution without generating a plasma.

6. The method of claim 1, wherein the protective layer is a passivation layer formed after the patterning of the dummy gate layer, and forming the protective layer comprises depositing a dielectric material on the dummy gate.

7. The method of claim 1, wherein the first nanostructures and the second nanostructures are over a semiconductor fin, the dummy gate has a sidewall facing away from the second nanostructures and has a bottom surface contacting the isolation region, the sidewall of the dummy gate is disposed a first distance from the second nanostructures, and trimming the lower portion of the dummy gate comprises:
  etching the lower portion of the dummy gate until an outermost edge of the bottom surface of the dummy gate extends away from the semiconductor fin a second distance less than the first distance.

8. The method of claim 1, wherein the first nanostructures and the second nanostructures are over a semiconductor fin, the dummy gate has a sidewall facing away from the second nanostructures and has a bottom surface contacting the isolation region, the sidewall of the dummy gate is disposed a first distance from the second nanostructures, and trimming the lower portion of the dummy gate comprises:
  etching the lower portion of the dummy gate until an outermost edge of the bottom surface of the dummy gate extends away from the semiconductor fin a second distance equal to the first distance.

9. The method of claim 1, wherein trimming the lower portion of the dummy gate forms a sidewall recess in the lower portion of the dummy gate.

10. A method comprising:
  forming a first dummy gate on a sidewall of a dummy nanostructure, a sidewall of a semiconductor nanostructure, and a top surface of an isolation region, the dummy nanostructure and the semiconductor nanostructure protruding above the top surface of the isolation region;
  forming a protective layer over an upper portion of the first dummy gate, a lower portion of the first dummy gate being exposed;
  reducing a width of the lower portion of the first dummy gate while the protective layer covers the upper portion of the first dummy gate;
  forming a second dummy gate over the first dummy gate, the dummy nanostructure, and the semiconductor nanostructure; and
  replacing the second dummy gate, the first dummy gate, and the dummy nanostructure with a gate structure, the gate structure wrapped around the semiconductor nanostructure.

11. The method of claim 10, further comprising:
  forming a hybrid fin on a sidewall of the first dummy gate, the second dummy gate being formed over the hybrid fin.

12. The method of claim 11, further comprising:
  before forming the hybrid fin, removing the protective layer.

13. The method of claim 11, wherein the hybrid fin is formed in contact with the protective layer.

14. The method of claim 10, wherein after reducing the width of the lower portion of the first dummy gate, the width of the lower portion of the first dummy gate is less than a width of the upper portion of the first dummy gate.

15. The method of claim 10, wherein after reducing the width of the lower portion of the first dummy gate, the width of the lower portion of the first dummy gate is equal to a width of the upper portion of the first dummy gate.

16. The method of claim 10, wherein the protective layer comprises $SiGeS_xO_yN_z$.

17. A method comprising:
  forming a first dummy gate on a sidewall of a dummy nanostructure, a sidewall of a semiconductor nanostructure, and a top surface of an isolation region, the dummy nanostructure and the semiconductor nanostructure protruding above the top surface of the isolation region;
  after forming the first dummy gate, reducing a width of a lower portion of the first dummy gate, the width of the lower portion of the first dummy gate being less than or equal to a width of an upper portion of the first dummy gate;
  after reducing the width of the lower portion of the first dummy gate, forming a hybrid fin on a sidewall of the first dummy gate;
  forming a second dummy gate over the hybrid fin, the first dummy gate, the dummy nanostructure, and the semiconductor nanostructure; and
  replacing the second dummy gate, the first dummy gate, and the dummy nanostructure with a gate structure, the gate structure wrapped around the semiconductor nanostructure.

18. The method of claim 17, wherein before reducing the width of the lower portion of the first dummy gate, the width of the lower portion of the first dummy gate is greater than the width of the upper portion of the first dummy gate.

19. The method of claim 17, further comprising:
  forming a recess in the dummy nanostructure and the semiconductor nanostructure; and
  growing an epitaxial source/drain region in the recess, the gate structure formed adjacent the epitaxial source/drain region.

20. The method of claim 17, wherein reducing the width of the lower portion of the first dummy gate forms a sidewall recess in the lower portion of the first dummy gate.

* * * * *